USOO9634371B2

United States Patent
Swarup et al.

(10) Patent No.: US 9,634,371 B2
(45) Date of Patent: Apr. 25, 2017

(54) TRANSMISSION LINE CIRCUIT ASSEMBLIES AND PROCESSES FOR FABRICATION

(71) Applicant: COM DEV International Ltd., Cambridge (CA)

(72) Inventors: Arvind Swarup, Kitchener (CA); David Davitt, Cambridge (CA)

(73) Assignee: COM DEV International Ltd., Cambridge (CA)

(*) Notice: Subject to any disclaimer, the term of this patent is extended or adjusted under 35 U.S.C. 154(b) by 63 days.

(21) Appl. No.: 14/571,846

(22) Filed: Dec. 16, 2014

(65) Prior Publication Data
US 2015/0180110 A1   Jun. 25, 2015

Related U.S. Application Data

(60) Provisional application No. 61/917,513, filed on Dec. 18, 2013.

(51) Int. Cl.
*H01P 5/08* (2006.01)
*H03H 7/38* (2006.01)
(Continued)

(52) U.S. Cl.
CPC ............. *H01P 5/08* (2013.01); *H01P 5/028* (2013.01); *H01P 11/00* (2013.01); *H03H 7/38* (2013.01); *Y10T 29/49004* (2015.01)

(58) Field of Classification Search
CPC . H01P 5/08; H01P 5/028; H01P 11/00; H03H 7/38
(Continued)

(56) References Cited

U.S. PATENT DOCUMENTS 3,201,721 A   8/1965   Voelcker
3,686,624 A   8/1972   Napoli et al.
(Continued)

FOREIGN PATENT DOCUMENTS

CA   2103763 C    2/1995
EP   0798802 A2  10/1997
(Continued)

OTHER PUBLICATIONS

Harlan Howe Stripline Circuit Design, pp. 17-31, Artech House Publication, 1974.
(Continued)

*Primary Examiner* — Stephen E Jones
*Assistant Examiner* — Scott S Outten
(74) *Attorney, Agent, or Firm* — Bereskin & Parr LLP/S.E.N.C.R.L., s.r.l.; Isis E. Caulder

(57) ABSTRACT

A transmission line circuit assembly has a substrate layer having a transmission line trace, further having a functional portion and a transitional portion. An enclosure of the assembly houses the transitional portion of the transmission line trace. A first surface of a dielectric plug is conductively coupled to an inner top surface of the enclosure. A second surface of the plug is aligned and spaced apart from the transitional portion of the transmission line trace to define a gap therebetween. An interfacing portion of a connecting pin is housed within the enclosure and bonded to the transitional portion. A connecting portion of the pin is connectable to an external conductor. The gap may be filled with a dielectric material. The transitional portion, dielectric plug, dielectric filler and connecting pin form an electromagnetic transition providing tuning and matching of the function portion with the external conductor.

22 Claims, 33 Drawing Sheets

(51) Int. Cl.
*H01P 11/00* (2006.01)
*H01P 5/02* (2006.01)

(58) Field of Classification Search
USPC .......................................................... 333/33
See application file for complete search history.

(56) References Cited

U.S. PATENT DOCUMENTS

| | | | |
|---|---|---|---|
| 4,375,053 | A | 2/1983 | Viola et al. |
| 4,450,418 | A | 5/1984 | Yum et al. |
| 4,721,929 | A | 1/1988 | Schnetzer |
| 4,831,345 | A | 5/1989 | Schiavone |
| 5,489,880 | A | 2/1996 | Swarup |
| 5,633,615 | A | 5/1997 | Quan |
| 5,929,729 | A | 7/1999 | Swarup |
| 6,170,154 | B1 | 1/2001 | Swarup |
| 6,861,923 | B2 | 3/2005 | Kolehmainen et al. |
| 2003/0179055 | A1 | 9/2003 | Sweeney et al. |
| 2005/0146391 | A1* | 7/2005 | Lee .................... H01P 1/047 333/34 |
| 2005/0237137 | A1 | 10/2005 | Dutta |
| 2007/0069832 | A1 | 3/2007 | Tanbakuchi et al. |
| 2007/0205847 | A1* | 9/2007 | Kushta ................ H05K 1/0222 333/33 |

FOREIGN PATENT DOCUMENTS

| | | |
|---|---|---|
| EP | 1041665 A1 | 10/2000 |
| WO | 02/56409 A1 | 7/2002 |

OTHER PUBLICATIONS

Russell R Homung, John C.Frankosky, "Microwave Laminate Material Considerations for Multilayer Applications", Proceeding of 37th European Microwave Conference, pp. 1425-1428, Munich, Germany, Oct. 2007.
The Extended European Search Report. International Application No. 14198628.1 dated May 26, 2015.
Fernandes, et al., "Double Semiconductor Substrate in Overlay Shielded Superconducting Microstrip Lines", International Journal of Infrared and Millimeter Waves, 1996, 17(8); 1391-1402.
Office Action issued Apr. 15, 2016 in corresponding EP Patent Application No. 14198628.1.

* cited by examiner

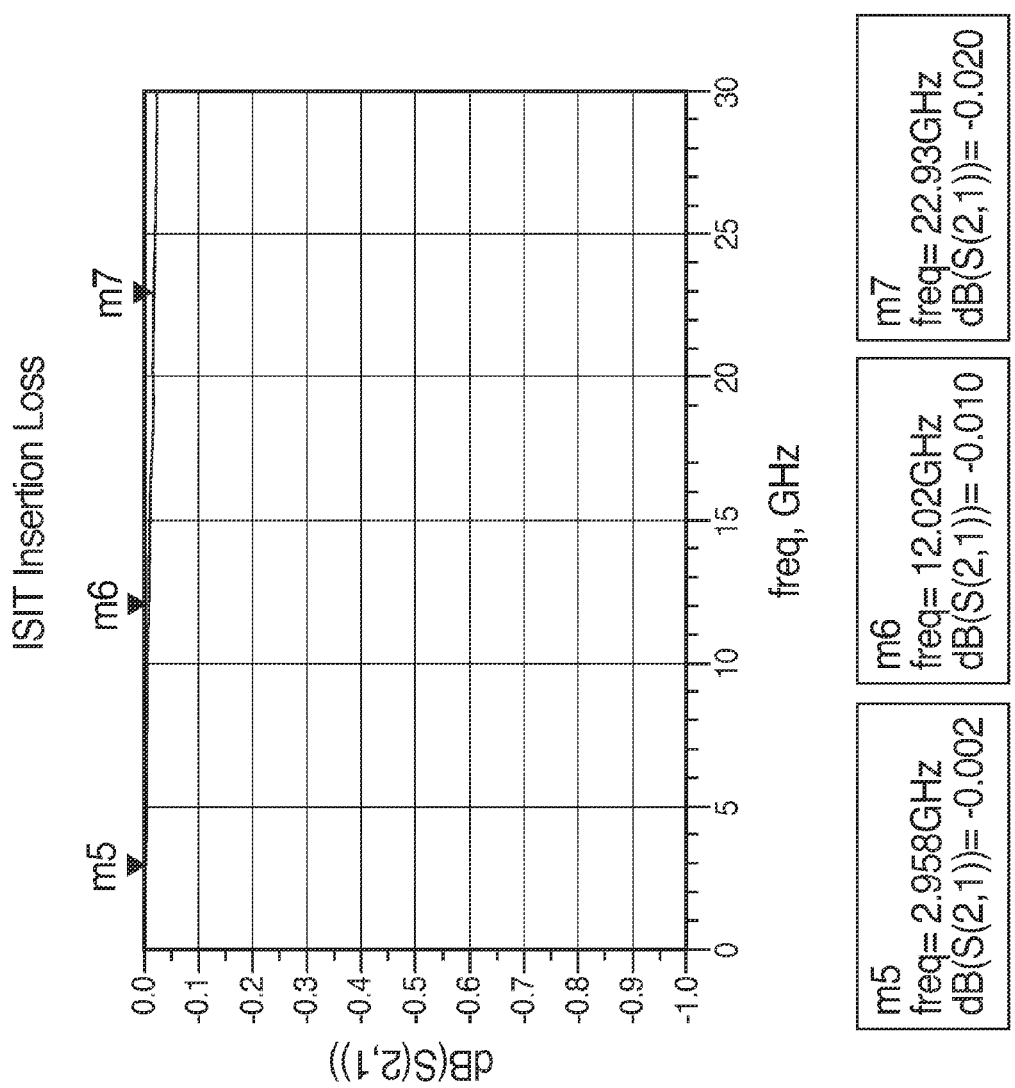

TRANSMISSION LINE CIRCUIT ASSEMBLIES AND PROCESSES FOR FABRICATION

RELATED PATENT APPLICATION

The present application claims priority from provisional patent application No. 61/917,513, filed Dec. 18, 2013 and entitled "TRANSMISSION LINE CIRCUIT ASSEMBLIES AND PROCESSES FOR FABRICATION", the disclosure of which is incorporated by reference in its entirety.

FIELD

The present disclosure generally relates to field of transmission line circuit assemblies and processes for fabrication thereof. More specifically, the embodiment of the present disclosure relates to an assembly and process for fabrication thereof having a matched interface for connection to an external conductor.

INTRODUCTION

Microwave devices having microwave circuits and microwave integrated circuits, for example, Wilkinson power dividers and their multipart derivatives, hybrid couplers, filters, amplifiers and mixers to name a few, are considered as functional passive and active microwave components operating at RF and microwave frequencies (300 MHz to 33 GHz) and are used in various applications. These applications include, for example, aerospace and satellite-based communication systems, which are often implemented in environments characterized by harsh operating conditions. These conditions define the governing boundary conditions for acceptability and compliance of such microwave devices.

Due to the harshness of typical operating conditions, the governing boundary conditions are often strict, resulting in complex and problematic implementation of microwave devices used for such applications. For example, design, implementation and construction of such microwave devices may require extensive validation and testing, which is often iterative and labor intensive. Consequently, the time and cost required to implement and construct these devices can be significantly increased.

SUMMARY

The present disclosure provides in one aspect a transmission line circuit assembly comprising a substrate layer having formed thereon a transmission line trace, the transmission line trace having a functional portion and a transitional portion, an enclosure housing at least the transitional portion of the transmission line trace, a dielectric plug having opposing first and second surfaces, the first surface being conductively coupled to an inner top surface of the enclosure and the second surface being aligned and spaced apart from the transitional portion of the transmission line trace to define a gap therebetween, a connecting pin having an interfacing portion and a connecting portion, the interfacing portion being housed within the enclosure and being bonded to the transitional portion of the transmission line trace, and the connecting portion being connectable to an external conductor.

The transmission line trace may be a stripline trace formed in the substrate layer and the substrate layer may have a non-recessed portion and a recessed portion, the functional portion of the stripline trace may be formed in the non-recessed portion and the transitional portion may be formed in the recessed portion and wherein the dielectric plug may be aligned with the recessed portion of the substrate layer.

The transmission line trace may be a microstrip trace and wherein the functional portion of the transmission line trace may be located outside of the enclosure.

The transmission line trace may be a microstrip trace and wherein the functional portion and the transitional portion of the transmission line trace may be housed in the enclosure.

The transmission line trace transitional portion, the connecting pin interfacing portion, and the gap may form an electromagnetic transition 400 between the transmission line functional portion and the external conductor.

The impedance transition may have an impedance of approximately 50 ohms.

The width of the transmission line trace transitional portion may be variable along its length to define at least one matching element.

The at least one matching element may be chosen from a notch, a stub, T-shape, S-shape, and offset T-shape.

The one or more dimensions of the transmission line trace transitional portion may be chosen based on at least a simulated electromagnetic performance of the transmission line functional portion.

The gap may be filled with air.

The gap may be filled with a dielectric filler having a dielectric constant substantially greater than 1.

The dielectric filler may be chosen based on at least a simulated electromagnetic performance of the transmission line functional portion.

The dielectric filler may be chosen from laminate material, glass reinforced laminate material, ceramic loaded laminate material, PTFE-based microwave laminate, liquid crystal polymer, ceramic based material, plastic based material, epoxy, silicone, acrylic and polyurethane.

The amount of the dielectric filler may be chosen based on at a simulated electromagnetic performance of the transmission line functional portion, the amount dielectric filler at least partially filling the gap.

The dielectric filler may surround the interfacing portion of the connecting pin, the surrounding reducing exertion of mechanical forces onto the interfacing portion of the connecting pin.

The thickness of the dielectric plug may be chosen based on at least a simulated electromagnetic performance of the transmission line functional portion.

The material forming the dielectric plug may be chosen based on at least a simulated electromagnetic performance of the transmission line functional portion.

The connecting pin interfacing portion may be coated in a nonconductive layer insulating the interfacing portion from conductive portions of the assembly other than the transmission line trace transitional portion.

The interfacing portion may be shielded from exertion of mechanical force from the dielectric plug thereon.

The top wall of the enclosure may define the inner top surface and may form a first ground plane, and a bottom wall of the enclosure may be conductively coupled to a bottom surface of the substrate layer and may form a second ground plane.

The interfacing portion may have a substantially elongated cross-section in a plane perpendicular to its direction of projection.

The transmission line trace functional portion may form one of a power divider, quadrature couplers, filter, amplifier, circulator, oscillator, and solid-state switch network.

The connecting portion of the connecting pin may extend through a throughhole of the enclosure, the assembly may further comprise a non-conductive dielectric bead substantially surrounding an outer surface of the connecting portion of the connecting pin, supporting the pin within the throughhole and providing suppression of mechanical forces on the connecting pin.

The transmission line circuit assembly may further comprise a connector mechanically coupled to the enclosure about the throughhole and the connecting pin may be expandable in its axial direction independently of an expansion of the connector.

The present disclosure provides in another aspect a process for manufacturing a transmission line circuit assembly. The process comprises bonding an interfacing portion of a connecting pin to a transitional portion of a transmission line trace, housing at least the transmission line trace transitional portion within an enclosure having a dielectric plug, a first surface of the dielectric plug being coupled to an inner top surface of the enclosure and a second surface of the dielectric plug being aligned and spaced apart from the transitional portion of the transmission line trace to define a gap therebetween.

The process may further comprise simulating an electromagnetic performance of a transmission line circuit, choosing dimensions of the transitional portion based on the simulated performance of the transmission line circuit, forming in a substrate layer the transmission line trace having a functional portion and the transitional portion, the functional portion of the transmission line trace being formed according to the simulated transmission line circuit and the transitional portion having the chosen dimensions.

The dimensions of the transitional portion may be further chosen based on a desired port-to-port frequency response of the transmission line circuit assembly.

The transitional portion may define at least one matching element.

The process may further comprise disposing a dielectric filler about the transitional portion, the dielectric filler occupying the gap when the transitional portion is housed within the enclosure and having a dielectric constant substantially greater than 1.

The process may further comprise simulating an electromagnetic performance of a transmission line circuit and choosing a material forming the dielectric filler based on the simulated performance of the transmission line circuit.

The material forming the dielectric filler may be further chosen based on a desired pod-to-port frequency response of the transmission line circuit assembly.

The material forming the dielectric filler may be chosen from laminate material, glass reinforced laminate material, ceramic loaded laminate material, PTFE-based microwave laminate, liquid crystal polymer, ceramic based material plastic based material, epoxy, silicone, acrylic and polyurethane.

The process may further comprise simulating a electromagnetic performance of a transmission line circuit and choosing a thickness of the dielectric plug based on the simulated performance of the transmission line circuit.

The thickness of the dielectric plug may be further chosen based on a desired port-to-port frequency response of the transmission line circuit assembly.

The process may further comprise simulating an electromagnetic performance of a transmission line circuit, and choosing a material of the dielectric plug based on the simulated performance of the transmission line circuit.

The bonding may be one of soldering, direct welding, conductive epoxy bonding, ribbon bonding, and wire bonding.

The process may further comprise coating the connecting pin interfacing portion in nonconductive layer to insulate the interfacing portion from conductive portions of the assembly other than the transmission line trace transitional portion.

The connecting portion of the connecting pin may extend through a throughhole of the enclosure and the assembly may further comprise a non-conductive dielectric bead substantially surrounding an outer surface of the connecting portion of the connecting pin, the dielectric bead supporting the pin within the throughhole and providing suppression of mechanical forces on the connecting pin and a connector mechanically coupled to the enclosure about the throughhole and wherein the connecting pin may be expandable in its axial direction independently of an expansion of the connector.

The process may further comprise adhering the first surface of the dielectric plug to the inner top surface of the enclosure, thereby providing the coupling of the dielectric plug to the enclosure, wherein the inner top surface forms a first ground plane, and adhering a bottom wall to a bottom surface of a substrate layer supporting the transmission line trace, the bottom wall forming a second ground plane.

The transmission line trace may be a stripline trace being supported by a substrate layer and the process may further comprise forming a recess at an edge region of a first surface of the substrate layer to expose the transitional portion of the transmission line trace.

The process may further comprise forming a recess on the top inner surface of the enclosure at a location corresponding to the recess of the first surface of the substrate layer and adhering the dielectric plug within the recess of the top inner surface.

DRAWINGS

A detailed description of various exemplary embodiments is provided herein below with reference to the following drawings, by way of example only, and in which:

FIG. 11A illustrates a graph of insertion loss of the simulated electromagnetic performance of a fourth exemplary modeled electromagnetic transition;

DESCRIPTION OF VARIOUS EMBODIMENTS

Figure 1:
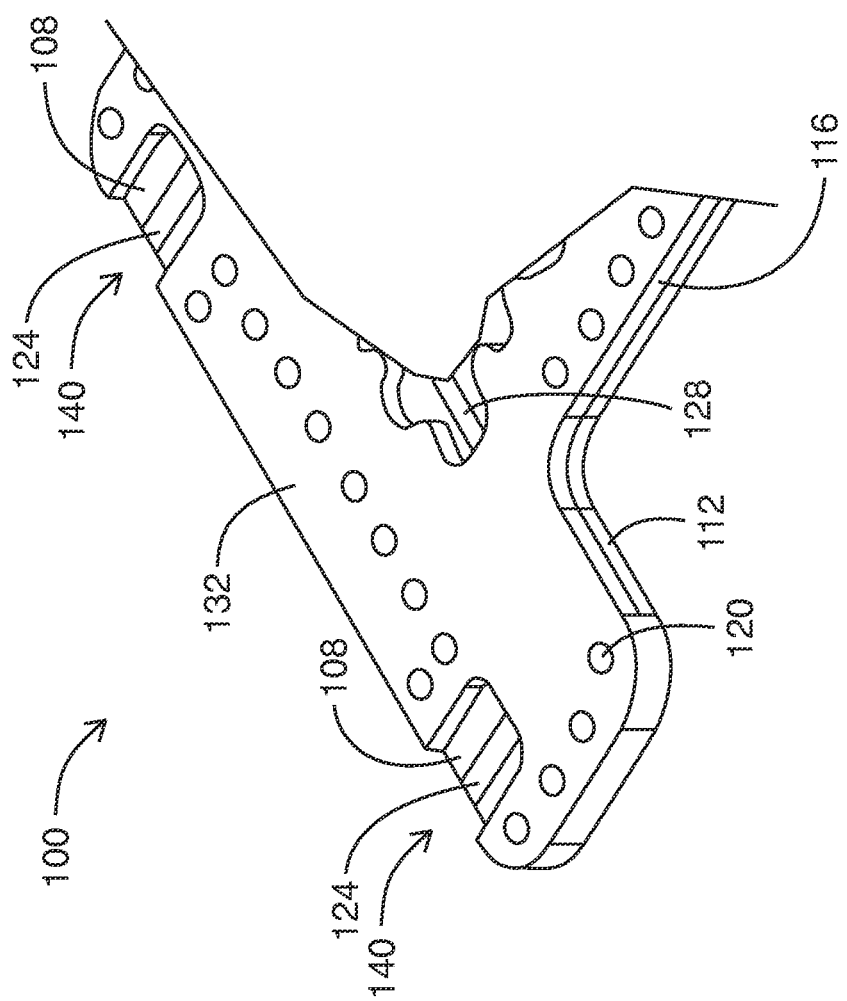
FIG. 1 illustrates a perspective view of a portion of a substrate layer according to various exemplary embodiments.

It will be appreciated that numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any ways, but rather as merely describing the implementation of the various embodiments described herein.

Compressed manufacturing schedules and shrinking budget demands have imposed new boundary conditions for current and future generations of microwave devices used, for example, in communications systems. These requirements get filtered down to lower level functional components.

One of the major challenges encountered is the practical realization and implementation of a suitable low cost microwave device offering the following desirable performance features:
- wideband mode-free impedance-invariant interconnections/transitions between a transmission line circuit and an external conductor; and
- continuous electromagnetic ground between the transmission line circuit's ground plane(s), and the external conductor.

"Transmission line" as used herein refers to technologies that provide a path for conduction of an electromagnetic signal, and may include striplines, microstrips, and/or coaxial line. For example, the transmission line path can be formed to define a circuit having particular electromagnetic characteristics and response. For example, the transmission line path can be formed in integrated circuit, such as a trace on a single-layer or multi-layer substrate (e.g. printed circuit board).

Transmission line circuits are commonly used in microwave communication devices, networks, subsystems, and systems. A transmission line circuit can be modularized to form a basic functional building block element of a larger device, network, subsystem, or system. For example, the functional building block is integrated within a higher level microwave system. For example, a plurality of transmission line circuits can form one or more transmission line network, such as a microwave network. A functional building block provides a plug-and-play approach, which further provides increased ease in system configuration and/or design while achieving desired signal characteristics and performance.

Examples of passive transmission line circuits include power divider, power combiners, N-port derivatives (N=2, 3, . . . ) of the power divider, N-port derivatives (N=2, 3 . . . ) of the power combiner and microwave filters (e.g. band pass filters, low pass, high pass, band stop filters) attenuators, phase shifters, circulators. Passive transmission line circuits are useful for microwave communication devices, subsystems, and systems, such as in power distribution networks for phased array antenna systems, local oscillator power distribution networks for multi-channel multi-frequency receiver systems, multichannel input multiplexer manifolds for satellite communication equipment's, and solid state N×M switch matrices for power routing in multichannel signal processing systems.

Examples of microwave networks, devices, subsystems, and systems having at least one transmission line circuit as an active functional element and/or control functional element include amplifiers, mixers, solid state switches, and oscillators.

Existing prior art microwave networks, devices, subsystems and systems formed of transmission line circuits are often costly or fail to satisfy the boundary conditions required for satellite communication system.

Stripline is a type of transmission line technology having a multi-layer structure that includes a ground-signal-ground configuration in which the signal carrying conductive path is sandwiched between a first (top) substrate layer (or superlayer) and a second (bottom) substrate layer (or sublayer). Substrate layers are further sandwiched between two conductive layers forming ground planes of the conductive path. For example, a stripline circuit or network is often understood as being a planar variation of a coaxial transmission line. The stripline circuit may be fabricated on commercially available substrate materials, such as soft substrates (e.g. PTFE based materials) and hard substrates (e.g. ceramic based material, such as LTCC and HTCC). For example, these materials are characterized by their inherently stable and homogeneous dielectric constant, low dielectric loss tangent property as well as controlled and well established physical properties. These characteristics allow the material to be suitable for use in the design and realization of high reliability microwave components and networks.

In one prior art stripline circuit, soft substrate materials are used to form the substrates forming a printed circuit board. The stripline circuit is traced onto the printed circuit board, which is further mounted to a base of a metallic enclosure. A connector is provided onto the metallic enclosure and electrically coupled to an interfacing end region of the stripline trace. The connector allows connection and electrically coupling of the stripline circuit to an external conductor, such as a coaxial cable or the connector of an additional transmission line circuit. The base of the metallic enclosure forms a first ground plane of the stripline circuit. A top lid to be positioned opposite the base of the metallic enclosure represents a second ground plane of the stripline circuit.

According to prior art stripline circuits, the two ground planes are formed by mechanically compressing the top lid towards the base of the metallic enclosure. The effectiveness of this stripline circuit becomes a function of the clamping pressure and is sensitive to surface irregularities, mechanical tolerances and potentially material creep or relaxation. For example, the prior art stripline circuit formed according to this process may (i) have insufficient or variable interaction between the top ground plane and the bottom ground plane and/or (ii) insufficient or variable interaction between the interfacing end region of the stripline trace and the connector. Accordingly, invasive techniques are used to overcome anomalies created during the circuit assembly process. The invasive techniques are applied iteratively until the desired frequency response of the stripline circuit is established. This is followed by a formal validation test campaign. Both the iterative application of the invasive techniques and validation test campaign are time consuming and increase the cost of implementation.

According to some prior art techniques, the connector is electrically coupled to the interfacing end region of the stripline trace via an intermediate microstrip line. The microstrip line further provides impedance matching (e.g. 50 ohms) between the stripline circuit and the connector. Existing techniques for electrically coupling the microstrip line to a center pin of the connector include ribbon (typically 0.010" wide Gold ribbon) attachment (solder or conductive epoxy) to wire (typically 0.001" diameter gold wire) bonding. The ribbon or wire interconnect is attached between the microstrip line and the center pin of the connector with an amount of stress relief to allow some thermally induced displacement or movement of the center pin relative to the signal carrying microstrip line. For example, the thermally induced displacement or movement can be caused by expansion of the metallic enclosure, substrate (e.g. printed circuit board), the center pin, or combination thereof. For example, each of these components may have different coefficients of thermal expansion. It will be appreciated that the thermally induced displacement or movement may be extreme for various application of the circuit (e.g. between less than −55° C. to over 125° C.).

The transition formed between the stripline trace and the microstrip line to the connecting pin includes a first discontinuity at the stripline trace to microstrip coupling and a second discontinuity at the microstrip line to the connector coupling. These discontinuities affect the electromagnetic properties of the interface between the stripline circuit and the connector. Further, for connectors that are coaxial SMA or K type, the portion of the connecting pin of the connector extending from an inner wall of the enclosure to the microstrip line introduces undesired reactive parasitics. For example, modes and parasitic reactances could also be generated because of ground plane discontinuity (imperfect substrate ground plane and connector ground) as well as the proximity of the top lid covering the exposed microstrip to coaxial interconnect area. These effects get progressively more pronounced as the operating frequency increases, for example above X band range (greater than 8 GHz), and are manifested in the form of performance degradation in port return loss and increased insertion loss.

Performance degradation of the microwave circuit due to the discontinuity effects can be generally compensated (e.g. tuned) by attaching precisely dimensioned thin patches of suitable conductor material (copper, beryllium copper or gold ribbon) material along the exposed microstrip line providing the electrical coupling between the stripline trace and the connector. However, this compensation process is invasive and must be performed in real time. Accordingly, this compensation process is time consuming, results in an increased parts count, increased operator handling time and a higher cost for manufacture as well as introducing additional risk in terms of device unreliability.

Furthermore, this compensation process is frequency sensitive since the suitable dimension of the precisely dimensioned thin patches of suitable conductor material become progressively smaller in order to suitably present the desired reactance to the circuit and compensate for interface parasitic elements to achieve the desired device frequency response. Another disadvantage of the compensation process is that an inherent phase and amplitude imbalance is induced which adds further complexity. Performance of the compensated circuit becomes temperature sensitive and has a risk of increased drift in phase and amplitude in some temperature ranges.

One prior art solution is to embed (e.g. sandwich) the connecting pin of the connector between the two substrate layers (or sublayers) of the stripline circuit at the interfacing end region of the stripline trace. This embedding theoretically conserves the stripline mode and reduces discontinuity effects. However, only soldering of the connecting pin to the interfacing end region of the stripline trace can be practically realized, while other means of bonding, such as ribbon bonding are impractical. Soldering significantly decreases the reliability of the circuit because once the soldered joint of the interfacing end region of the stripline trace with the connecting pin is embedded between the two substrate layers, it is no longer possible to inspect the quality of the joint or measure the stress incurred by this joint during the embedding process. Furthermore, electromagnetic performance of the circuit as a whole is dependent on the clamping pressure applied to the top lid of the enclosure that causes embedding of the connecting pin between the substrate layers or sublayers. This dependency on clamping pressure further decreases reliability of the circuit. This prior art solution requires extensive tuning, processing, optimization and validation testing before a circuit fabricated therefrom can be operated. Such tuning, processing, optimization and validation significantly increase the cost of fabricating a circuit according to this solution.

Microstrip is another type of transmission line technology in which the signal carrying conductive path is traced on a surface of a substrate layer and left exposed. An interfacing end region of the microstrip trace is bonded to a center pin of a connector using techniques such as ribbon (typically 0.010" wide Gold ribbon) attachment (solder or conductive epoxy) to wire (typically 0.001" diameter gold wire) bonding. The coupling of the microstrip trace to the center pin forms a discontinuity, which is subject to similar discontinuity effects as those affecting the microstrip to connector discontinuity of the stripline trace to microstrip line to connecting pin transition of a stripline circuit. For example, undesired reactive parasitics can be introduced. Generally, undesirable effects affecting prior art stripline circuits also affect microstrip circuits.

For example, the prior art microwave devices, subsystems and systems having the above described prior art transmission line circuit exhibit one or more of the following undesirable effects:

generation of undesired reactive parasitic effects and higher order modes impacting the device return loss frequency response;

requires invasive performance alignment for circuit anomaly compensation;

degraded electromagnetic performance; for example, the exposed connecting pin radiates energy at the point of discontinuity and impact the radiated emission requirement; and degraded reliability.

The undesirable effects described herein are present when the transmission line circuit must interface with an external conductor and there is a change in the type of conductive path at the interface. For example, there is a change in the type of conductive path where the transmission line circuit interfaces with a conductor that is not a transmission line circuit, such as a coaxial cable or connector. For example, there is also a change in the type of conductive path where the transmission line circuit of a first type interfaces with another transmission line circuit of another type, such as from stripline to microstrip or vice versa. The undesirable effects are present at both an input of the transmission line circuit and at an output of the transmission line circuit.

Referring now to FIG. 1, therein illustrated is a perspective view of a portion of a substrate layer 100 according to various exemplary embodiments. The substrate layer 100 has formed thereon a transmission line trace defining a conductive path. The transmission line trace may define one or more passive lumped components, such as capacitors, resistors and/or inductors. Accordingly, the transmission line trace defines a transmission line circuit. Alternatively, or additionally, the substrate layer 100 may further have formed thereon active and passive devices and/or passive lumped components that are electrically coupled to the transmission line trace and define with the transmission line trace the transmission line circuit.

The substrate 100 may be formed of a dielectric material typically used in transmission line circuits. For example, many different hard and soft substrates for integrated printed circuit applications are available. These include soft substrates produced by Rogers corporation, ARLON and Taconic in varying dielectric constant ranging from 2 to 10.2. They are available in varying thickness ranging from 0.005" to 0.050" or thicker. In the hard substrate realm, ceramic derivatives are common including High temperature co-fired ceramic (HTCC) and Low temperature co-fired Ceramic (LTCC).

The selection of dielectric material forming the substrate layer may be dependent on ease of implementation, cost of manufacturing and space heritage/application heritage.

Although various commercially available soft substrate material can be utilized, the availability of suitable pre-preg material (glue material used for laminating substrate layers) with similar electrical and physical properties to those of the selected dielectric material forming the substrate layer may affect the material used for the substrate layer. For dielectric materials with high dielectric constant i.e. greater than 4.5, the selection may be dependent upon the availability of processes for reproducibly forming a transmission line trace having a high impedance onto the substrate layer (fine transmission line widths with high tolerance; typically less than ±0.0005").

The transmission line trace is formed on the substrate layer 100 according to methods and processes known in the art, such as etching, photolithography, and stencil printing technology.

The exemplary embodiment illustrated in FIG. 1 is a stripline type transmission line circuit wherein the transmission line trace is embedded inside the dielectric substrate layer 100. It will be understood that terms "on" or "thereon" used herein with reference to transmission line trace being formed on the substrate layer 100, includes the transmission line trace being embedded inside the dielectric substrate layer 100.

For example, the transmission line trace may be embedded inside the dielectric substrate layer 100 by forming the transmission line trace on a top surface 108 of a first substrate sub-layer 112 and coupling a second substrate sub-layer 116 to the surface 108 of the first substrate sub-layer 112, thereby sandwiching the transmission line trace between the first and second substrate sub-layers 112, 116. The first and second sub-layers 112, 116 are formed of the same dielectric material. The first and second sub-layers 112, 116 may be coupled together using a lamination process. For example, the lamination process uses a matched pre-preg material having a pressed thickness that is controlled so that the transmission line trace is equally spaced from the top and bottom surfaces of the substrate layer 100. The pressed thickness may be further controlled so that total thickness of the substrate layer does not exceed a design thickness value within an allowed tolerance of ±10%. For example, adhering to these conditions during the lamination of the first and second sub-layers 112, 116 ensures that the stripline circuit will be a balanced stripline transmission line circuit in a homogeneous medium.

According to various exemplary embodiments, the top and bottom surfaces of the substrate layer 100 may be covered with a conductive foil layer, which represent respective ground planes that define the integrity of the stripline transmission line circuit properties (e.g. propagation of dominant TEM mode). The presence of the top and bottom ground planes allows the stripline circuit to support a fundamental TEM propagation mode (both the electric and magnetic fields are perpendicular to the longitudinal direction of the transmission line). Since the ground planes do not extend to infinity, the fields decay rapidly in the transverse direction. This property significantly reduces any electromagnetic fields being radiated from the substrate layer 100.

For example, the stripline type transmission line circuit may further include a plurality of conductive vias 120 (e.g. picket fences) extending transversely from a top planar surface 132 of the dielectric substrate layer 100 to a bottom planar surface of the dielectric substrate layer 100 to provide a conductive path therebetween. The conductive vias 120 ensure that ground planes are of the same potential and may further aid in suppressing generation of spurious modes (e.g. propagation of parallel plate modes) within the stripline transmission line circuit. For example, the first substrate 112, the transmission line trace, and the second substrate 116 may be formed as a multilayer printed circuit board According to various exemplary embodiments, the plurality of conductive vies 120 may be positioned proximate edges of the substrate layer 100 and spaced apart in a direction parallel to the planar surface of the substrate layer 100 by a distance that is less than a minimum wavelength of a signal expected to propagate through the transmission line circuit. For example, this spacing of the conductive vias 120 provides a transverse electric wall. Alternatively, or additionally, lateral sides of the substrate layer 100 may be covered in conductive plating extending between the top surface 132 and the bottom surface of the substrate layer 100. The conductive plating may be useful where the frequency of the signal expected to propagate through the transmission line circuit is increased and the spacing between conductive vias 120 becomes too small and impractical for fabrication.

For example, manufacturing the stripline transmission line circuit as a printed circuit board using vacuum-assisted lamination processes to couple the first and second dielectric sub-layers 112, 116 provides a homogeneous structure that is insensitive to minor surface irregularities on the transmission line surface and does not rely on mechanical compression to maintain dielectric spacing and ground integrity.

According to various exemplary embodiments, the transmission line trace is of the microstrip type, and the transmission line trace is left exposed on a surface of the substrate layer 100.

The formed transmission line trace includes a functional portion 128 and at least one transitional portion 124.

The functional portion 128 corresponds to the portion of the trace that provides the principal electromagnetic behavior of the transmission line circuit. Principal electromagnetic behavior herein refers to the general function which characterizes the transmission line circuit defined at least in part by the transmission line trace. For example, the general function is evaluated between at least one of the inputs and at least one of the outputs of the transmission line circuit. For example, the transmission line circuit can be characterized as being one of a power divider, quadrature coupler, filter, amplifier, oscillator, circulator, and solid-state switch network.

By way of example only, FIG. 1 illustrates a portion of the second substrate sub-layer 116 being cut away to reveal a sub-portion of the functional portion 128 of the transmission line trace. It will be understood that the functional portion 128 may define one or more nodes and have a variable width to provide various electromagnetic behaviors.

The at least one transitional portion 124 corresponds to a portion of the transmission line trace that provides part of the electromagnetic transitioning of the functional portion 128 of the transmission trace with an external conductor. For example, the transitional portion 124 corresponds to an end region of the transmission line trace. For example, the transitional portion 124 may be defined by its interaction with other elements providing the transitioning of the functional portion 128 of the transmission line trace with the external conductor. For example, the substrate layer 100 includes a plurality of transitional portions 124, each transitional portion 124 representing a port of the transmission line circuit defined in part by the transmission line trace.

According to exemplary embodiments where the substrate layer 100 includes a transmission line trace of the stripline type, the substrate layer 100 includes at least one recess 140 to expose a portion of the transmission line trace formed thereon. For example, the exposed portion of the transmission line trace corresponds to a transitional portion 124. The recess 140 may be formed in the top surface 132 of the substrate layer 100. For example, the recess 140 may be formed by cutting away a corresponding portion of the second substrate sub-layer 116. Alternatively, the second substrate sub-layer 116 may have a preformed discontinuity, wherein coupling the second substrate sub-layer 116 to the surface 108 of the first substrate sub-layer 112 defines the recess 140 of the substrate layer 100.

Figure 2:
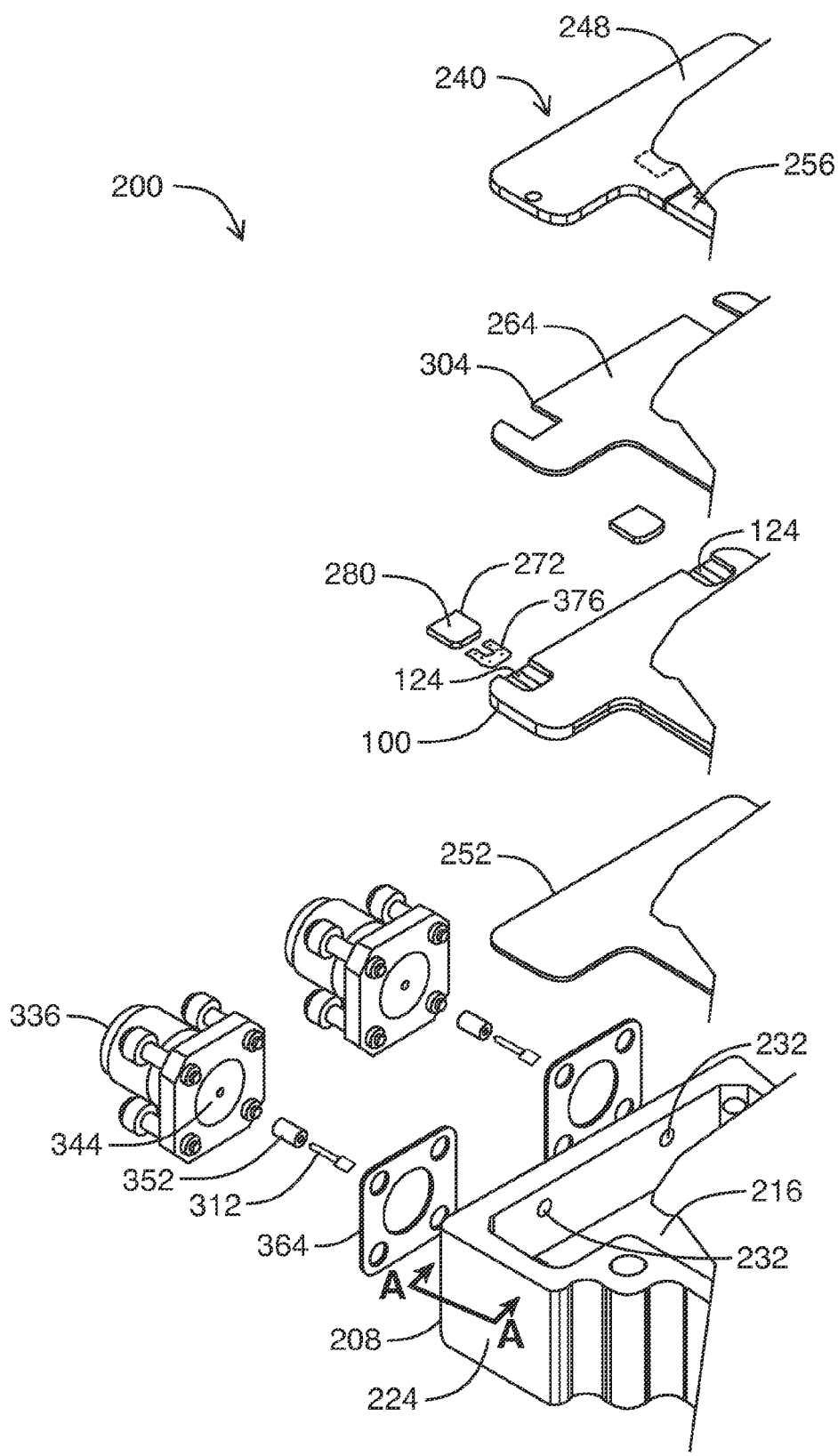
FIG. 2 illustrates an exploded view of the transmission line circuit assembly according to various exemplary embodiments.

Referring now to FIG. 2, therein illustrated is an exploded view of a portion of a transmission line circuit assembly 200 according to various exemplary embodiments. The transmission line circuit assembly includes a conductive enclosure for housing at least the transitional portion 124 of the transmission line trace. For example, the enclosure provides an electromagnetic cage, thereby providing a seal against leakage from at least the transitional portion housed in the enclosure.

According to various exemplary embodiments, the enclosure includes an enclosure body 208, which further has a planar bottom wall 216 and lateral walls 224 extending transversely from the planar bottom wall 216. The enclosure body 208 defines a cavity in which can be housed at least the transitional portion 124 of the transmission line trace. For example, the lateral walls 224 have formed therein at least one throughhole 232 providing fluid communication between the cavity defined by the enclosure body 208 and the environment outside the enclosure body 208. The at least one throughhole 232 is formed at a location corresponding to a location of at least one transitional portion 124 housed within the enclosure. For example, the enclosure body 208 includes a throughhole 232 for each of the transitional portions 124 of the transmission fine trace.

The enclosure further includes a top wall 240, which may be positioned opposite the bottom wall 216. The top wall 240 is sized to extend between the lateral walls 224 of the enclosure body 208 and to substantially seal the cavity defined by the enclosure body 208. For example, a bead of conductive epoxy 236 (FIG. 4) may further adhere the edges of the top wall 240 to the lateral walls 224 to further improve the sealing of the cavity. Sealing the cavity with the top wall 240 suppresses any electromagnetic leakage from the cavity of the enclosure. The top wall 240 further provides a continuous and uniform ground for the transmission line circuit housed in the enclosure, which further ensures signal integrity. For example, each of the enclosure body 208 and the top wall 240 may be formed of a conductive metal, such as aluminum.

According to various exemplary embodiments, the top wall 240 includes at least a first sub-portion 248 and a second sub-portion 256, which may be shifted laterally in a direction parallel to a plane defined by the top wall 240. The shifting of first and second sub-portions 248, 256 allows a planar size of the top wall 240 to be varied. Accordingly, when the top wall 240 is positioned opposite the bottom wall 216 to seal the cavity of the enclosure, the at least first and second sub-portions 248, 256 may be shifted to abut against corresponding lateral walls 224 of the enclosure body 208. The abutting of the first and second sub-portions 248, 256 closes any gaps formed between edges of the top wall 240 and corresponding lateral walls 224, further improving the electromagnetic sealing of the cavity of the enclosure.

At least a portion of the substrate layer 100 corresponding to a transitional portion 124 of the transmission line trace is positioned in the cavity defined by the enclosure. For example, a first conductive layer 252 is disposed between the bottom wall 216 of the enclosure body 208 and a bottom surface of the substrate layer 100. For example, the first conductive layer 252 is formed of a silver loaded adhesive. For example, the conductive layer 252 provides a continuous equi-potential ground contact between the substrate layer 100 and the enclosure. For example, the conductive layer 252 further mechanically adheres the bottom surface of the substrate layer 100 to the bottom wall 216 of the enclosure body 208. For example, the conductive layer 252 aids in electromagnetically sealing the substrate layer 100 (e.g. reducing radiated emissions to less than 80 dBi). For example, the conductive layer 252 provides relief to mechanical stress due to mismatching of the coefficient of thermal expansions between the substrate layer 100 (e.g. 12 ppm/CC) and an aluminum enclosure (24 ppm/° C.).

According to various exemplary embodiments, the transmission line circuit defined in part by the transmission line trace is a stripline circuit and a second conductive layer 264 is disposed between an inner surface of the top well 240 and a top surface 132 of the substrate layer 100. For example, the second conductive layer 264 is formed of the same material as the first conductive layer 252. For example, the second conductive layer 264 also provides a continuous equi-potential ground contact between the substrate layer 100 and the enclosure. For example, the second conductive layer 264 further mechanically adheres the top surface 132 of the substrate layer 100 to an inner surface of the top wall 240. For example, the second conductive layer 264 further aids in electromagnetically sealing the substrate layer 100 (e.g. reducing radiated emissions to less than 80 dBi). For example, the second conductive layer 264 provides relief to mechanical stress due to mismatching of the coefficient of thermal expansions between the substrate layer 100 (e.g. 12 ppm/° C.) and an aluminum enclosure (24 ppm/° C.).

According to various exemplary embodiments, the transmission line circuit defined in part by the transmission line trace is a stripline circuit and the enclosure houses the whole of the substrate layer 100, including the functional portion 128 and each of the transitional portions 124 of the transmission line trace.

Figure 4:
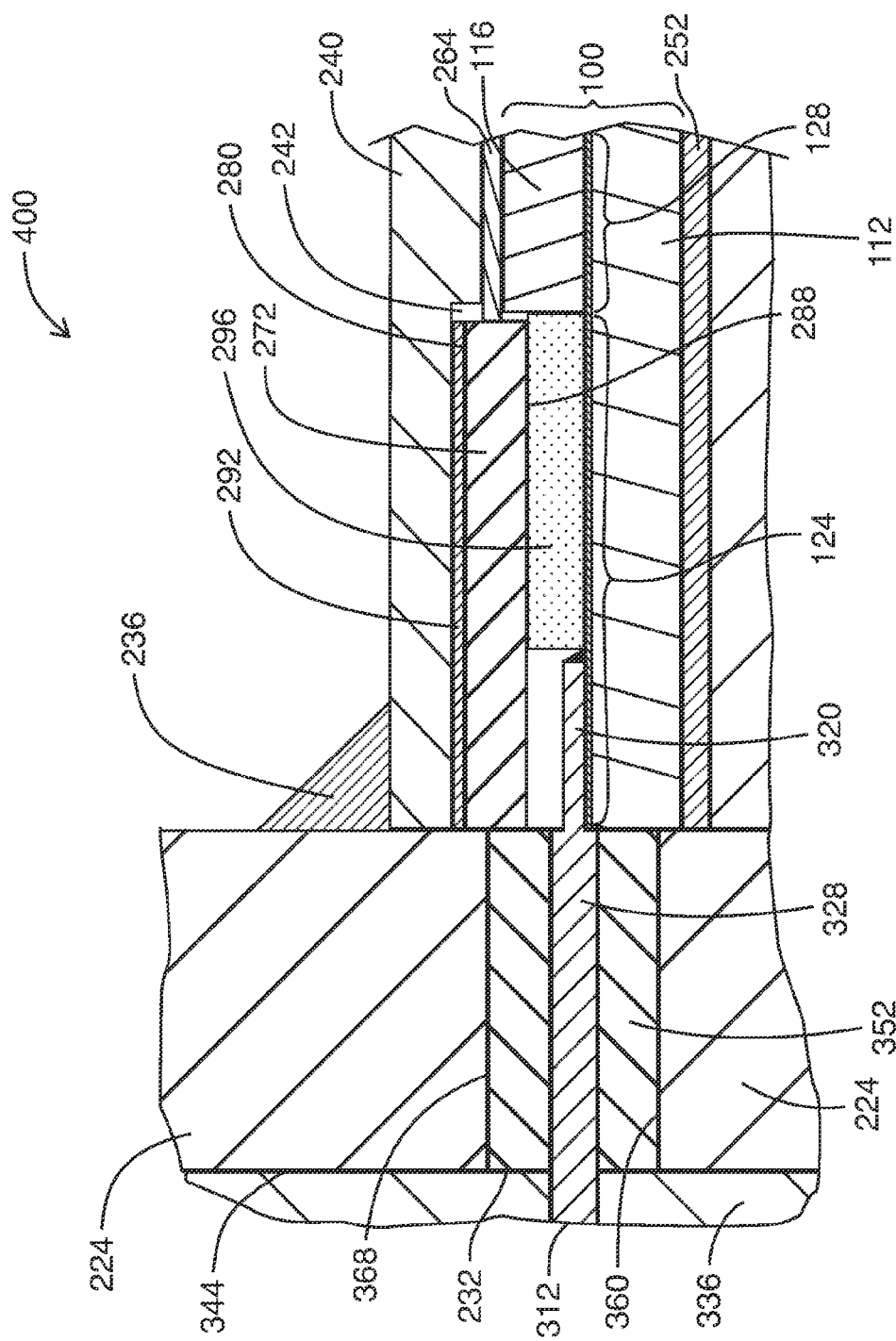
FIG. 4 illustrates a sectional view of an electromagnetic transition taken along the line A-A of FIG. 2, according to various exemplary embodiments.

According to various exemplary embodiments, the transmission line circuit defined in part by the transmission line trace is a microstrip circuit and the enclosure houses the whole of the substrate layer 100. At least the functional portion 128 of the transmission line trace is exposed on the upper surface 132 of the substrate layer 100. The top wall 240 is further positioned within the cavity of the enclosure at a height along the lateral walls 224 to be spaced apart from the upper surface 132 of the substrate layer 100 to define a gap 296 therebetween (FIG. 4). For example, due to the gap 296, compressive forces on the top of the enclosure in a direction of the planar bottom wall 216 are not transmitted to the transitional portion 124 and the interfacing portion 320 of the connecting pin 312, thereby ensuring consistency of the bond therebetween.

According to various alternative exemplary embodiments, the transmission line circuit defined in part by the transmission line trace is a microstrip circuit and the enclosure houses one of the transitional portions 124 of the substrate layer 100. The functional portion 128 of the transmission line trace is exposed outside the enclosure. For example, the exemplary transmission line circuit assembly includes a plurality of enclosures, each housing one transitional portion 124 of the transmission line trace.

The transmission line circuit assembly 200 further includes a dielectric plug 272 having a first surface 280 and a second surface 288 (FIG. 4) opposite the first surface 280.

The first surface 280 of the dielectric plug 272 is conductively coupled to an inner top surface of the enclosure at a location corresponding to one of the transitional portions 124 of the transmission line trace. Accordingly, the second surface 288 of the dielectric plug 272 is aligned with the transitional portion 124 when the circuit assembly 200 is assembled. For example, a conductive epoxy layer 292 glues the first surface 280 of the dielectric plug 272 to the inner top surface of the enclosure.

For example, the dielectric plug 272 is conductively coupled to an inner surface of the top wall 240 of the enclosure at a location such that the second surface 288 of the dielectric plug 272 is aligned with the transitional portion 124 when the top wall 240 is positioned opposite the bottom wall 216 to electromagnetically seal the enclosure. When the circuit assembly 200 is assembled, the dielectric plug 272 is positioned along a height of the lateral walls 224 to be spaced apart from the transitional portion 124 of the transmission line trace to define a gap 296 therebetween in a direction orthogonal to a plane defined by the substrate layer 100.

According to various exemplary embodiments, the top inner surface of the enclosure may be recessed at the location corresponding to the transitional portion 124 of the transmission line trace. For example, the inner surface of the top wall 240 is recessed. For example, the recess 242 is formed by milling the inner surface of the top wall 240. For example, the recess of the top inner surface of the enclosure has a size corresponding to the size of the dielectric plug 272. The dielectric plug 272 may be partially positioned within the recess of the top inner surface with a heightwise portion of the dielectric plug 272 extending from the top inner surface. Placing of the dielectric plug 272 within the recess aids in maintaining the positioning of the dielectric plug 272 and its alignment with the transitional portion 124 of the transmission line trace.

According to various exemplary embodiments, the dielectric plug is selected to be 0.005" thinner compared to the thickness of the substrate layer 100. For example, the substrate layer 100 may have a thickness of 0.020". For example, the first surface 280 of the dielectric plug is covered with a conductive foil enabling reliable adhesion of the plug 272 to the inner top surface of the enclosure and the second ground plane. For example, second surface 288 of the plug facing the transitional portion 124 of the transmission line trace is exposed and free of a conductive covering layer.

According to various exemplary embodiments where the substrate layer 100 includes a recess 140 (FIG. 1) exposing one of the transitional portions 124 of the transmission line trace, the dielectric plug 272 is aligned with the recess 140. For example, the size of the recess 140 in a direction parallel to a top surface 132 of the substrate layer 100 substantially corresponds to the size of the dielectric plug 272. For example, the dielectric plug 272 partially projects into the recess 140 of the substrate layer 100, further ensuring alignment of the dielectric plug 272 with the transitional portion 124.

According to various exemplary embodiments, a dielectric plug 272 is provided for each transitional portion 124 of the transmission line trace.

The assembly 200 further comprises at least one connecting pin 312. For example, the connecting pin 312 is formed of a conductive metal such as copper or gold. The connecting pin 312 has a generally elongated shape having an interfacing portion 320 and a connecting portion 328 (FIG. 4). For example, the interfacing portion 320 and the connecting portion 328 are integrally formed. The interfacing portion 320 is positioned within the enclosure and is bonded to one of the transitional portions 124 of the transmission line trace to form an electrical connection therebetween. For example, the interfacing portion 320 is bonded to the transitional portion 124 of the transmission line trace according one of soldering, direct welding, conductive epoxy bonding, ribbon bonding, and wire bonding. For example, the interfacing portion 320 may be coated with a non-conductive layer, such as non-conductive epoxy, to electrically insulate the interfacing portion 320 of the connecting pin 312 from all conductive elements of the assembly 200 other than the transitional portion 124 and the connecting portion 328. For example, various conductive layers or conductive beads used to electromagnetically seal the enclosure may seep to various areas of the enclosure during fabrication of the assembly 200, and the non-conductive layer prevents electrical contact of these seeped materials with the interfacing portion 320 of the connecting pin 312. The connecting portion 328 of the connecting pin projects through one of the lateral walls 224 of the enclosure so that a portion of the connecting portion 328 protrudes from an outer surface of the lateral wall 224. The protruding portion of the connecting portion 328 of the connecting pin 312 is connectable to an external conductor.

According to various exemplary embodiments, the transmission line circuit assembly 200 further includes a connector 336. For example, the connector 336 is a field replaceable connector. For example, the connector 336 is mechanically coupled to a lateral wall 224 of the enclosure. The connector 336 provides a mechanical interface for coupling to an external connector having the external conductor. For example, the external connector may be a coaxial cable or a connector of another electromagnetic circuit or network. When the connector 336 is appropriately mechanically coupled to the external connector, the connecting pin 312 is electrically coupled to the conductor of the external connector to form a conductive path therebetween.

Figure 3A:
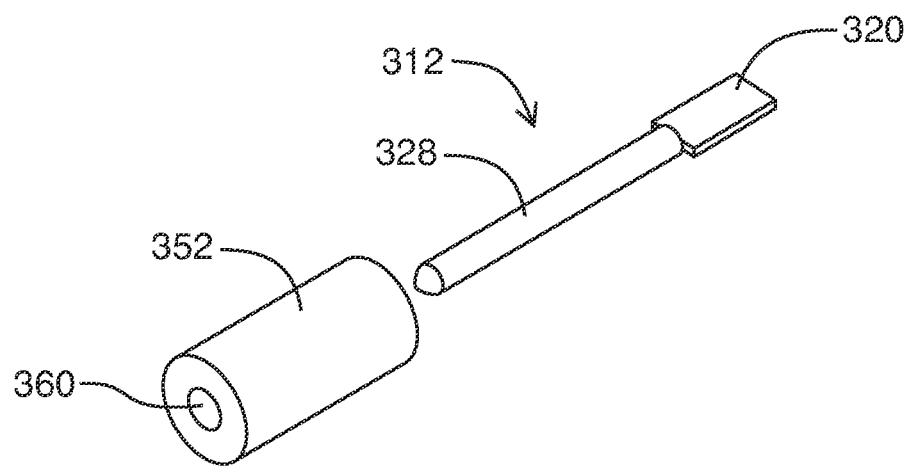
FIG. 3A illustrates an exploded view of a connecting pin and dielectric bead assembly according to various exemplary embodiments.
Figure 3B:
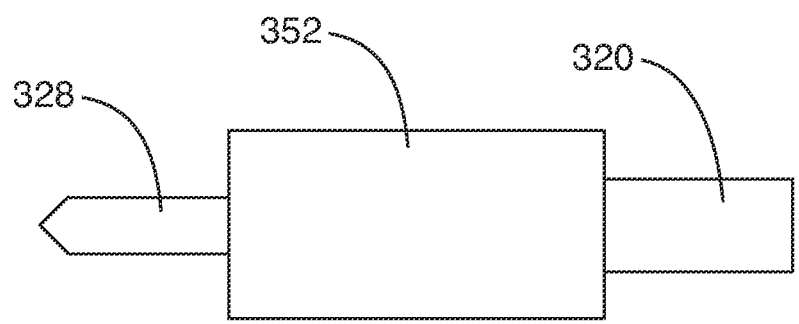
FIG. 3B illustrates a side elevation view of a connecting pin and dielectric bead assembly according to various exemplary embodiments.

According to various exemplary embodiments, the assembly 200 further includes a non-conductive bead 352 defining a hollow channel 360 (FIGS. 3A and 3B). When the assembly 200 is assembled, the connecting portion 328 of the connecting pin 312 projects through the hollow channel 360 and the dielectric bead 352 substantially surrounds the connecting portion. For example, the dielectric bead 352 is formed of Teflon.

Referring now to FIGS. 3A and 3B, therein illustrated are an exploded view and a side elevation view, respectively, showing the dielectric bead 352 and the connecting pin 312 according to various exemplary embodiments. For example, the connecting portion 328 of the connecting pin 312 is cylindrical and the interfacing portion 320 is substantially planar. For example, when the interfacing portion 320 is bonded to the transitional portion 124 of the transmission line, the interfacing portion 320 is oriented so that it has a substantially elongated cross-section in a plane perpendicular to its direction of projection.

According to various exemplary embodiments, the dielectric bead 352 is disposed within the throughhole 232 of the lateral wall 224 of the enclosure. An outer surface 368 of the dielectric bead 352 contacts an inner surface of the throughhole 232 to mechanically support the connecting pin 312 within the throughhole 232. For example, the dielectric bead 352 provides a snug fit of the connecting pin 312 so as to minimize displacement or vibration of the connecting pin 312 in its radial direction (i.e. direction orthogonal to an axis of the connecting pin). For example, an inner surface of the throughole 232 and the connecting portion 320 of the connecting pin forms a coaxial transmission line, and the inner surface represents an outer ground.

According to various exemplary embodiments, the protruding portion of the connecting pin 312 partially projects into the connector 336 to contact a conducting pin of the connector 336.

It will be appreciated that according to various exemplary embodiments described herein where the assembly 200 includes the non-conductive bead 352, the connecting pin 312 is not directly mechanically connected to the connector 336 but is only supported by its bond to the transitional portion 124 and its positioning in the non-conductive bead 352. For example, by being mechanically decoupled from the connector 336, the connecting pin 312 may be displaced or expanded in its axial direction independently of an axial displacement or expansion of the connector 336, thereby reducing mechanical stresses on the connecting pin 312 and its bond to the transitional portion 124 of the transmission line trace. For example, such mechanical stresses may otherwise be introduced due to a mismatch in the coefficient of expansion. This reduction of mechanical stresses allows for potting of the bonding of the interfacing portion 320 of the connecting pin 312 to the transitional portion 124 of the transmission line trace without transferring significant mechanical stresses to the bond.

According to various exemplary embodiments, the connector 336 is a SMA connector. However, it will be understood that the connector 336 may also form a SMK connector. For example, the connecting pin 312 and the dielectric bead 352 are dimensioned using standard coaxial transmission line theory to provide a matched impedance (e.g. 50 Ohm impedance) and support the efficient electromagnetic signal propagation (e.g. minimizing mismatching losses and discontinuity effects) with the connector 336. For example, the connector 336 is a field replaceable connector.

According to various exemplary embodiments, a conductive shim 364 may be disposed between a coupling surface 344 of the connector 336 and an outer surface of the lateral wall 224 to suppress any residual leakage of electromagnetic energy via the connector 336 and the lateral wall 224. For example, the conductive shim 364 is a beryllium copper shim of appropriate thickness.

According to various exemplary embodiments, the transmission line circuit assembly 200 further includes a dielectric filler 376, which may be located in the gap 296 formed between the transitional portion 124 of the transmission line circuit and the second surface 288 of the dielectric plug. As described herein, the dielectric filler 376 provides electromagnetic matching and tuning of the transmission line circuit assembly 200 and the functional portion 128 of the transmission line circuit. For example, the dielectric filler 376 is disposed between the second surface 288 of the dielectric plug 272 and the transitional portion 124. For example, where the substrate layer 100 is recessed, the filler 376 fills the recess between the dielectric plug 272 and the top surface 108 of the first sub-layer 112.

According to various exemplary embodiments, the dielectric filler 376 is generally U-shaped. When the dielectric filler 376 is positioned in the gap 296 of the assembly, two arms of the U-shaped dielectric filler 376 extend on either side of the interfacing portion 320 of the connecting pin and the interfacing portion 320 is positioned in a space defined between the two arms. By not overlaying the dielectric filler 376 between the second surface 288 of the dielectric plug 272 and the interfacing portion 320 or by overlaying a thinner portion of the dielectric filler 376 therebetween, compressive or tensile forces applied on the enclosure in a direction between the top wall 240 and the bottom wall 216 are suppressed and are not substantially transmitted to the interfacing portion 320. Accordingly, the interfacing portion 320 and the bond with the transitional portion 124 are shielded from mechanical forces exerted between the top wall 240 and the bottom wall 216. For example these mechanical forces on the enclosure are significant during assembly of the circuit assembly 200, and transmission of these forces to the bonding of the interfacing portion 320 and the transitional portion 124 may substantially affect the electromagnetic characteristics of the bond. It will be appreciated that reducing the transmission of these forces provides greater consistency in the bonding of the interfacing portion 320 to the transitional portion 124 and greater consistency of the overall assembly of the circuit assembly 200.

Referring now to FIG. 4, therein illustrated is a section view of a transitioning region of the transmission line circuit assembly 200 along the line A-A of FIG. 2 when the transmission line circuit assembly 200 is fully assembled according to various exemplary embodiments. The dielectric plug 272, the bonding of the transitional portion 124 of the transmission line trace with interfacing portion 320 of the connecting pin 312, and the gap 296 form an electromagnetic transition 400 between the functional portion 128 of the transmission line and an external conductor.

For example, the electromagnetic transition 400 has a matched impedance that matches with an impedance of the functional portion 128 of the circuit and an impedance of the external conductor. For example, the electromagnetic transition 400 has an impedance of 50 ohms. For example, the electromagnetic transition 400 provides an improvement in the return loss and insertion loss between the functional portion 128 and an external conductor. For example, the electromagnetic transition 400 further provides tuning of the transmission line circuit so that the electromagnetic characteristics (e.g. frequency response) obtained between the connecting pin 312 and a connecting pin 312 of another electromagnetic transition 400, corresponding to another transitional portion 124 of the transmission line, are improved or is closer to desired electromagnetic characteristics. For example, each electromagnetic transition 400 of the transmission line circuit assembly 200 corresponds to a port (input or output) of the transmission line circuit.

According to various exemplary embodiments, at least one property of at least one element of the electromagnetic transition 400 is chosen to obtain predetermined, specific and/or desired electromagnetic characteristics of the electromagnetic transition 400. For example, the at least one characteristic of at least one element of the electromagnetic transition 400 is chosen so that the expected electromagnetic characteristics substantially match the predetermined, specific and/or desired electromagnetic characteristics within acceptable tolerances. For example, expected electromagnetic characteristics of the electromagnetic transition 400 are determined based on simulated electromagnetic performance of a model of an electromagnetic transition 400. For example, the simulated electromagnetic performance of the model of the electromagnetic transition includes modeled scattering parameters. For example, the model of the electromagnetic transition 400 is a computer-generated model.

The predetermined, specific and/or desired electromagnetic characteristics of the electromagnetic transition 400 is chosen based on at least one characteristic of the functional portion 128 of the transmission line trace. For example, the at least one characteristic of the functional portion 128 is a simulated electromagnetic performance of a model of a functional portion 128. For example, the simulated electromagnetic performance of the model of the functional portion 128 includes modeled scattering parameters. For example, the model circuit is a computer-generated model circuit.

For example, predetermined, specific and/or desired electromagnetic characteristics of the electromagnetic transition 400 are determined based on a measured or simulated electromagnetic performance when the electromagnetic transition 400 is cascaded with the functional portion 128. For example, the predetermined, specific and/or desired electromagnetic characteristics of the electromagnetic transition 400 are determined based on a simulated electromagnetic performance when the model of the electromagnetic transition 400 is cascaded with the model of the functional portion 128. For example, the predetermined, specific and/or desired electromagnetic characteristics of the electromagnetic transition 400 is determined so that the cascading of the functional portion 128 of the transmission line trace with the electromagnetic transition 400 provides predetermined, specific and/or desired electromagnetic characteristics of the transmission line circuit assembly 200. For example, electromagnetic characteristics of the transmission line circuit assembly 200 includes the frequency response between the connecting pin 312 of a first electromagnetic transition 400 representing a first transitional portion and the connecting pin 312 of a second electromagnetic transition 400 representing a second transitional portion, which may represent port-to-port frequency response.

The at least one property of at least one element of the electromagnetic transition 400 is chosen so that signal integrity is conserved between the electromagnetic transition 400 and the functional portion 128 when the two are cascaded. The at least one property of at least one element of the electromagnetic transition 400 may be further chosen to minimize discontinuity effects between the electromagnetic transition 400 and the functional portion 128. For example, such discontinuity effects may otherwise distort the performance of the cascaded electromagnetic transition 400 and the functional portion 128 of the transmission line trace.

According to various exemplary embodiments, the at least one property of at least one element of the electromagnetic transition 400 includes the type of material for filing the gap 296. The type of material for filling the gap 296 may be chosen based on dielectric constant of the material, dissipation factor of the material, or a combination thereof. For example, the gap 296 is filled with a material having a dielectric constant of approximately 1, such as air or vacuum. Alternatively, the gap 296 is filled with a dielectric filler 376 formed of a material having a dielectric constant substantially greater than 1. For example, the dielectric filler 376 is chosen from laminate material, glass reinforced laminate material, ceramic loaded laminate material, PTFE-based microwave laminate, liquid crystal polymer, ceramic based material, plastic based material, epoxy, silicone, acrylic and polyurethane coating. For example, the dielectric filler 376 is formed of a material having a dielectric constant that is substantially different from the material forming the substrate layer 100. For example, electromagnetic performance of the functional portion 128 of the transmission line trace is simulated and predetermined, specific and/or desired electromagnetic characteristics of the electromagnetic transition 400 are determined based on the simulated performance.

Expected electromagnetic characteristics of electromagnetic transitions 400 having each a dielectric filler 37'6 formed of different materials are obtained. Dielectric filler materials that provide acceptable matching of the expected electromagnetic characteristics to the predetermined, specific and/or desired electromagnetic characteristics are chosen as acceptable dielectric fillers 376 for the electromagnetic transition 400 of the transmission line circuit assembly 200. For example, an acceptable dielectric filler 376 includes a dielectric filler 376 that when applied in a modeled electromagnetic transition 400 that is cascaded with a modeled functional portion 128 of the transmission line trace causes the transmission line circuit assembly 200 to have the predetermined, specific and/or desired electromagnetic characteristics of the transmission line circuit assembly 200.

According to various exemplary embodiments, in addition to the type of material for filling the gap 296, the at least one property of at least one element of the electromagnetic transition 400 includes an amount of the dielectric filler 376. For example, the amount of dielectric filler 376 may be defined by a thickness of the filler 376 in a direction between the second surface 288 of the dielectric plug 272 and the transitional portion 124. For example, electromagnetic performance of the functional portion 128 of the transmission line trace is simulated and predetermined, specific and/or desired electromagnetic characteristics of the electromagnetic transition 400 are determined based on the simulated performance.

Expected electromagnetic characteristics of electromagnetic transitions 400 having each a different combination of filler material type and filler amount are obtained. Combinations that provide acceptable matching of the expected electromagnetic characteristics to the predetermined, specific and/or desired electromagnetic characteristics are chosen as acceptable combinations the dielectric filler material and dielectric filler amount for the electromagnetic transition 400 of the transmission line circuit assembly 200. For example, an acceptable combination of the dielectric filler material and dielectric filler amount includes a combination that when applied in a modeled electromagnetic transition 400 that is cascaded with a modeled functional portion 128 of the transmission line trace causes the transmission line circuit assembly 200 to have the predetermined, specific and/or desired electromagnetic characteristics of the transmission line circuit assembly 200.

According to various exemplary embodiments, the at least one property of at least one element of the electromagnetic transition 400 includes the thickness of the dielectric plug 272. It will be appreciated that varying the thickness of the dielectric plug 272 further changes the distance of the gap 296 between the second surface of the dielectric plug 272 and the transitional portion 124 of the dielectric plug 272. For example, electromagnetic performance of the functional portion 128 of the transmission line trace is simulated, and predetermined, specific and/or desired electromagnetic characteristics of the electromagnetic transition 400 are determined based on the simulated performance.

Expected electromagnetic characteristics of electromagnetic transitions 400 having each a dielectric plug 272 of a different thickness are obtained. The thickness of the dielectric plug 272 that provides acceptable matching of the expected electromagnetic characteristics to the predetermined, specific and/or desired electromagnetic characteristics is chosen as acceptable thickness of the dielectric plug 272 for the electromagnetic transition 400 of the transmission line circuit assembly 200. For example, an acceptable thickness of the dielectric plug 272 includes a dielectric plug 272 that when applied in a modeled electromagnetic transition 400 that is cascaded with a modeled functional portion 128 of the transmission line trace causes the transmission line circuit assembly 200 to have the predetermined, specific and/or desired electromagnetic characteristics of the transmission line circuit assembly 200.

According to various exemplary embodiments, the at least one property of at least one element of the electromagnetic transition 400 includes the type of material forming the dielectric plug 272. The material forming the dielectric plug 272 may be chosen based on dielectric constant of the material, dissipation factor of the material, or a combination thereof. For example, the dielectric plug 272 is formed of a material having a dielectric constant that is substantially equal to the dielectric constant of the material of the substrate layer 100. Alternatively, the dielectric plug 272 is formed of a material having a dielectric constant that is substantially different from the material forming the substrate layer 100. For example, the material forming the dielectric plug 272 is chosen from laminate material, glass reinforced laminate material, ceramic loaded laminate material, PTFE-based microwave laminate, liquid crystal polymer, ceramic based material, plastic based material, epoxy, silicone, acrylic and polyurethane coating. According to various exemplary embodiments, the dielectric filler 376 and the dielectric plug 272 may be formed of the same material. For example, the dielectric filler 376 and the dielectric plug 272 may be contiguous.

For example, electromagnetic performance of the functional portion 128 of the transmission line trace is simulated and predetermined, specific and/or desired electromagnetic characteristics of the electromagnetic transition 400 are determined based on the simulated performance. Expected electromagnetic characteristics of electromagnetic transitions 400 having each a dielectric plug 272 formed of a different materials are obtained, and dielectric plug materials that provide acceptable matching of the expected electromagnetic characteristics to the predetermined, specific and/or desired electromagnetic characteristics are chosen as acceptable dielectric plug materials for the electromagnetic transition 400 of the transmission line circuit assembly 200. For example, an acceptable dielectric plug material includes a type of dielectric plug material that when applied in a modeled electromagnetic transition 400 that is cascaded with a modeled functional portion 128 of the transmission line trace causes the transmission line circuit assembly 200 to have the predetermined, specific and/or desired electromagnetic characteristics of the transmission line circuit assembly 200.

Figure 5:
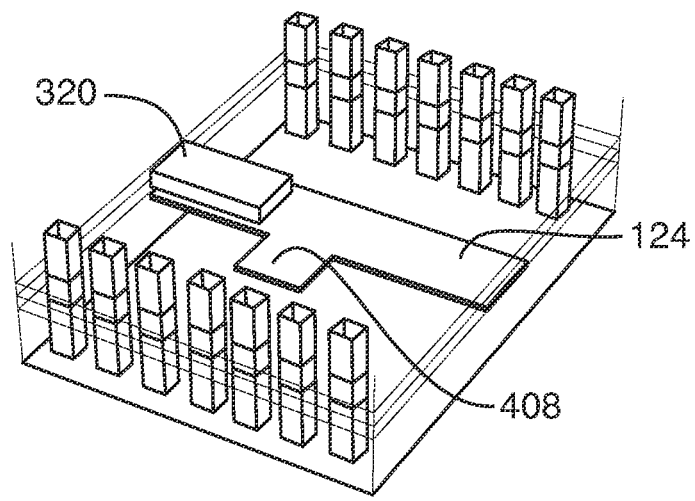
FIG. 5 illustrates a perspective view of a model of transitional portion of a transmission line trace according to various exemplary embodiments.
Figure 6:
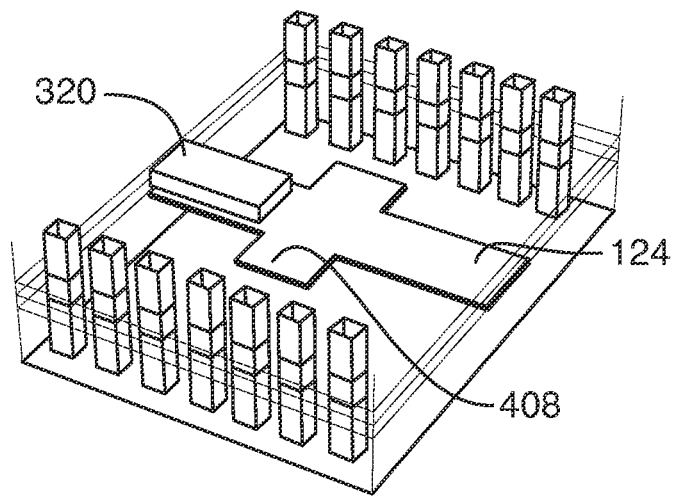
FIG. 6 illustrates a perspective view of a model of transitional portion of a transmission line trace according to various exemplary embodiments.
Figure 7:
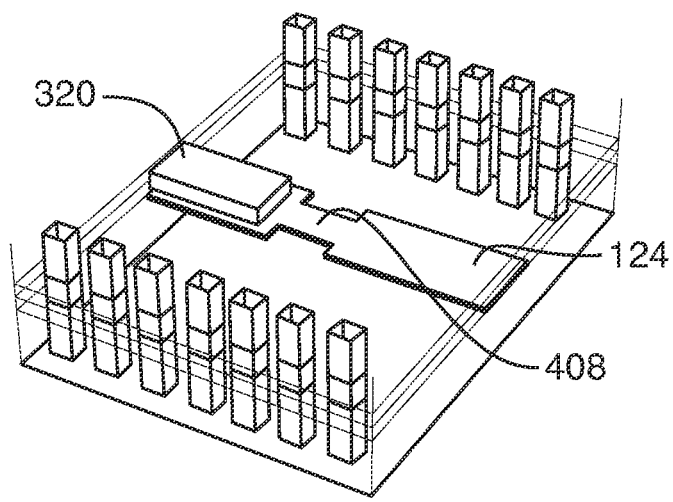
FIG. 7 illustrates a perspective view of a model of transitional portion of a transmission line trace according to various exemplary embodiments.

Referring now to FIGS. 5, 6, and 7, therein illustrated are perspective views of models of three transitional portions according to various exemplary embodiments. For example, the at least one property of at least one element of the electromagnetic transition 400 includes a shape of transitional portion 124 of the transmission line trace. For example, a width of the transitional portion 124 in a direction transverse to the axis of the connecting pin 312 is variable along the length of the transitional portion 124. For example, the variable width defines at least one matching element 408 that causes a change in the electromagnetic characteristics of the transmission line trace. For example, the at least one matching element 408 may be one or more of a stub, notch, T-shape, offset T-shape, S shape, or other known matching elements or a combination thereof.

For example, FIG. 5 illustrates a transitional portion having a matching element 408 being a lateral stub.

For example, FIG. 6 illustrates a transitional portion having a matching element 408 being a T-shape.

For example, FIG. 7 illustrates a transitional portion having a matching element 408 being notches defined by portions of the transitional portions having a smaller width.

For example, electromagnetic performance of the functional portion 128 of the transmission line trace is simulated, and predetermined, specific and/or desired electromagnetic characteristics of the electromagnetic transition 400 are determined based on the simulated performance. Expected electromagnetic characteristics of electromagnetic transitions 400 having each a transitional portion 124 having a different set of dimensions are obtained, and the transitional portions corresponding to the sets of dimensions that provides acceptable matching of the expected electromagnetic characteristics to the predetermined, specific and/or desired electromagnetic characteristics is chosen as acceptable transitional portions 124 for the electromagnetic transition 400 of the transmission line circuit assembly 200. For example, an acceptable dimensions of the transitional portion 124 includes a dimensions that when applied in a modeled electromagnetic transition 400 that is cascaded with a modeled functional portion 128 of the transmission line trace causes the transmission line circuit assembly 200 to have the predetermined, specific and/or desired electromagnetic characteristics of the transmission line circuit assembly 200.

According to various exemplary embodiments, the at least one property of at least one element of the electromagnetic transition 400 includes at least two of the shape of the transitional portion 124, material for the dielectric filler 376, amount of the dielectric filler 376, the thickness of the dielectric plug 272 and the material of the dielectric plug 272. For example, electromagnetic performance of the functional portion 128 of the transmission line trace is simulated and predetermined, specific and/or desired electromagnetic characteristics of the electromagnetic transition 400 are determined based on the simulated performance.

Expected electromagnetic characteristics of electromagnetic transitions 400 having each a different combination of at least two of the shape of the transitional portion 124, material for the dielectric filler 376, amount of the dielectric filler 376, the thickness of the dielectric plug 272 and the material of the dielectric plug 272 are obtained. Combinations that provide acceptable matching of the expected electromagnetic characteristics to the predetermined, specific and/or desired electromagnetic characteristics are chosen as acceptable combinations of at least two of the shape of the transitional portion 124, material for the dielectric filler 376, amount of the dielectric filler 376, the thickness of the dielectric plug 272 and the material of the dielectric plug 272 for the electromagnetic transition 400 of the transmission line circuit assembly 200. For example, an acceptable combination includes a combination that when applied in a modeled electromagnetic transition 400 that is cascaded with a modeled functional portion 128 of the transmission line trace causes the transmission line circuit assembly 200 to have the predetermined, specific and/or desired electromagnetic characteristics of the transmission line circuit assembly 200.

According to various exemplary embodiments of a process for forming the transmission line circuit assembly 200, the principal electromagnetic behavior of the transmission line circuit assembly 200 is selected. A model of a functional circuit providing the principal electromagnetic behavior is then generated and the electromagnetic performance of the functional circuit model is simulated. For example, a full wave electromagnetic simulation may be performed to extract S-parameters of the electromagnetic performance of the functional circuit model. For example, the model may correspond to the functional portion 128 of a transmission line circuit that has yet to be formed. Alternatively, the model may correspond to the functional portion 128 of a transmission line trace that has already been formed on a substrate layer 100.

According to various exemplary embodiments, a model of a first electromagnetic transition 400 having a known first set of properties that includes the shape of the transitional portion 124, material for the dielectric filler 376, amount of the dielectric filler 376, thickness of the dielectric plug 272 and the material of the dielectric plug 272 is generated. The model of the first electromagnetic transition 400 is then cascaded with the model of the functional circuit and the electromagnetic performance of the cascaded configuration is simulated. A model of a second electromagnetic transition 400 is generated, wherein the second electromagnetic transition has a known second set of properties wherein at least one of the shape of the transitional portion 124, material for the dielectric filler 376, amount of the dielectric filler 376, thickness of the dielectric plug 272 and the material of the dielectric plug 272 has been changed from the first set of properties of the first electromagnetic transition model. The model of the second electromagnetic transition 400 is then cascaded with the model of the functional circuit and the electromagnetic performance of the second cascaded configuration is simulated. The simulated electromagnetic performance is further compared with the simulated performance of the first cascaded configuration.

For example, performance may be compared based on at least one of a return loss and an insertion loss. For example, lower return loss or insertion loss indicates better performance. Models of additional electromagnetic transitions having varying properties of the shape of the transitional portion 124, material for the dielectric filler 376, amount of the dielectric filler 376, thickness of the dielectric plug 272 and the material of the dielectric plug 272 can be further generated, their performance simulated and compared with the performance of previously generated electromagnetic transition models. Accordingly, an optimization of the properties of elements of the electromagnetic transition is carried out to determine a set of properties of elements of the electromagnetic transition that provides acceptable or improved electromagnetic performance for a given application. Accordingly, the process includes choosing at least one of a shape or dimensions of the transitional portion, material forming the dielectric filler, amount of the dielectric filler, thickness of the dielectric plug and material of the dielectric plug based on the simulated performance of the modeled cascaded transmission line circuit. The set of properties of elements of the acceptable modeled electromagnetic transition may be then used for fabricating the electromagnetic transition of a transmission line circuit assembly 200 to be used in the field.

According to various exemplary embodiments, a first electromagnetic transition 400 having a known first set of is properties that includes the shape of the transitional portion 124, material for the dielectric filler 376, amount of the dielectric filler 376, thickness of the dielectric plug 272 and the material of the dielectric plug 272 is generated and cascaded to a first region of the functional circuit and a second electromagnetic transition having a known second set of properties that includes the shape of the transitional portion 124, material for the dielectric filler 376, amount of the dielectric filler 376, thickness of the dielectric plug 272 and the material of the dielectric plug 272 is generated and cascaded to a second region of the functional circuit. Accordingly, the first electromagnetic transition model represents a first port of the functional circuit and the second electromagnetic transition model represents a second of the functional circuit.

Further, the electromagnetic performance simulated corresponds to port-to-port electromagnetic characteristics (e.g. frequency response) of the cascaded functional circuit. An optimization can then be carried out by varying at least one property of the elements of either one or both of the first electromagnetic transition model and the second electromagnetic transition model. The simulated performance of the altered cascaded configuration is then compared against the simulated performance of a previously modeled cascaded configuration to determine a set of properties of the first electromagnetic transition and second electromagnetic model that will provide an acceptable electromagnetic performance for a given application.

Accordingly, the process includes choosing at least one of a shape or dimensions of the transitional portion, material forming the dielectric filler, amount of the dielectric filler, thickness of the dielectric plug and material of the dielectric plug based on the simulated port-to-port frequency response of the modeled cascaded transmission line circuit. The set of properties of elements of the first and second acceptable modeled electromagnetic transitions may be then used for fabricating the electromagnetic transitions of a transmission line circuit assembly 200 to be used in the field.

According to various exemplary processes for fabricating the transmission line circuit assembly 200, a dielectric substrate is provided and a transmission line trace is formed thereon. Accordingly, a substrate layer 100 is fabricated. For example, the transmission line trace has a functional portion 128 and at least one transitional portion 124 corresponding to the modeled functional circuit and the modeled at least one electromagnetic transition. For example, the at least one transitional portion 124 has dimensions corresponding to the acceptable dimensions determined from the optimization of the set of properties of the at least one electromagnetic transition.

According to various exemplary embodiments where the substrate layer 100 is a stripline circuit, a recess may be formed at a region corresponding to at least one of the transitional portions 124 to expose the transitional portion.

According to various exemplary processes for fabricating the transmission line circuit assembly 200, at least the transitional portion of the fabricated substrate layer 100 is disposed within the cavity of a metallic enclosure. For example, the at least one transitional portion 124 is aligned with a throughhole 232 of a lateral wall 224 of the enclosure. A bottom surface of the substrate layer 100 is adhered to a bottom wall 216 of the enclosure, whereby the bottom wall 216 forms a ground plane.

A connecting pin 312 is inserted through the throughhole 232. For example, the connecting pin 312 may be wrapped in the non-conductive bead 352 and supported within the throughhole 232. The interfacing portion 320 of the connecting pin 312 is then bonded to the transitional portion 124. For example, the exemplary process further includes coating the interfacing portion 320 with a non-conductive layer.

According to various exemplary processes where it is determined from the optimization of the set properties of the at least one electromagnetic transition that a dielectric filler 376 is to have a dielectric constant greater than 1, the process further includes disposing the dielectric filler 376 over the transitional portion 124 of the transmission line trace. The material of the dielectric filler 376 and the amount (e.g. thickness) is chosen according to the acceptable filler material and amount determined from the optimization of the set of properties of the at least one electromagnetic transition.

According to various exemplary processes, a dielectric plug 272 is fabricated. For example, the dielectric plug is formed of a material and has a thickness chosen according to acceptable materials and/or thicknesses determined from the optimization of the set of properties of the at least one electromagnetic transition. A first surface of the dielectric plug 272 is then adhered to an inner surface of a top wall. For example, the process further includes milling a recess in the inner surface of the top wall having a size substantially corresponding to the size of the plug 272.

According to various exemplary embodiments, the top wall is inserted into the cavity of the enclosure and mechanically compressed towards the bottom wall. Accordingly, the top wall electromagnetically seals the enclosure and the dielectric plug 272 is aligned with and spaced apart from the transitional portion 124 of the transmission line to define the gap 296.

According to various exemplary embodiments, the process may further include mechanically coupling a connector 336 to an outer wall of the metallic enclosure, the connecting portion of the pin 312 being aligned with the connector 336.

According to various exemplary embodiments of the transmission line circuit assembly 200 described herein and formed according to exemplary processes described herein, the dominant mode of propagation of a signal is conserved between the transitional portion 124 and the functional portion 128 of the transmission line trace. Furthermore, properties of the electromagnetic transition that provide matching and tuning of the functional portion 128 may be determined according to electromagnetic simulation prior to fabrication, thereby substantially reducing the amount of in-vivo turning required during and after fabrication.

EXPERIMENTS

Five electromagnetic transitions, each having a different experimental set of properties where modeled. The simulated electromagnetic performance was obtained for each of the five modeled electromagnetic transitions. Physical electromagnetic transitions were then fabricated according to each experimental set of properties. Electromagnetic performances for the five fabricated electromagnetic transitions were compared against the simulated electromagnetic performances.

The five experimental sets of properties of the modeled and fabricated electromagnetic transitions are set out in Table 1.

TABLE 1

| Variable Parameter | First set | Second set | Third set | Fourth set | Fifth set |
| --- | --- | --- | --- | --- | --- |
| Dielectric Plug Thickness (mils) | 15 | 15 | 20 | 15 | 20 |
| Plug dielectric constant | 2.94 | 2.94 | 4.2 | 2.94 | 2.7 |
| Bottom Substrate Height,(mils) | 20 | 20 | 20 | 20 | 20 |
| Void region Gap, (mils) | 7 | 7 | — | 7 | — |
| Substrate Dielectric Constant, $\epsilon_s$ | 2.94 | 2.94 | 2.94 | 2.94 | 2.94 |
| Gap Dielectric Constant, $\epsilon_{gap}$ | 1 | 4.2 | 4.2 | 2.7 | 2.7 |
| Trace Width, W (mils) | 32 | 24 | 23 | 24 | 23 |

According to the first experimental set of properties, the modeled and fabricated electromagnetic transitions have a void region gap 296 that is filled with air/vacuum ($\epsilon_{gap} \approx 0.1$).

According to the second experimental set of properties, the modeled and fabricated electromagnetic transitions have a gap 296 that is filled with a dielectric filler 376 having a dielectric constant of about 4.2. The void region gap of Table 1 corresponds to a distance between a top surface of the transitional portion 124 of the transmission line trace and a bottom surface 288 of the dielectric plug 272.

According to the third experimental set of properties, the modeled and fabricated electromagnetic transitions is filled between the transitional portion 124 and an inner top surface of the enclosure with a dielectric material having a dielectric constant of about 4.2. For example, the dielectric plug 272 is chosen to be formed of a material having a dielectric constant of 4.2 and the dielectric filler 376 filling the gap 296 has a dielectric constant of about 4.2.

According to the fourth experimental set of properties, the modeled and fabricated electromagnetic transitions have a gap 296 that is partially filled with a dielectric filler 376 having a dielectric constant of about 2.7.

According to the fifth experimental set of properties, the modeled and fabricated electromagnetic transitions is filled between the transitional portion 124 and an inner top surface of the enclosure with a dielectric material having a dielectric constant of about 2.7. For example, the dielectric plug 272 is chosen to be formed of a material having a dielectric constant of about 2.7 and the dielectric filler 376 filling the gap 296 has a dielectric constant of about 2.7.

Figure 8A:
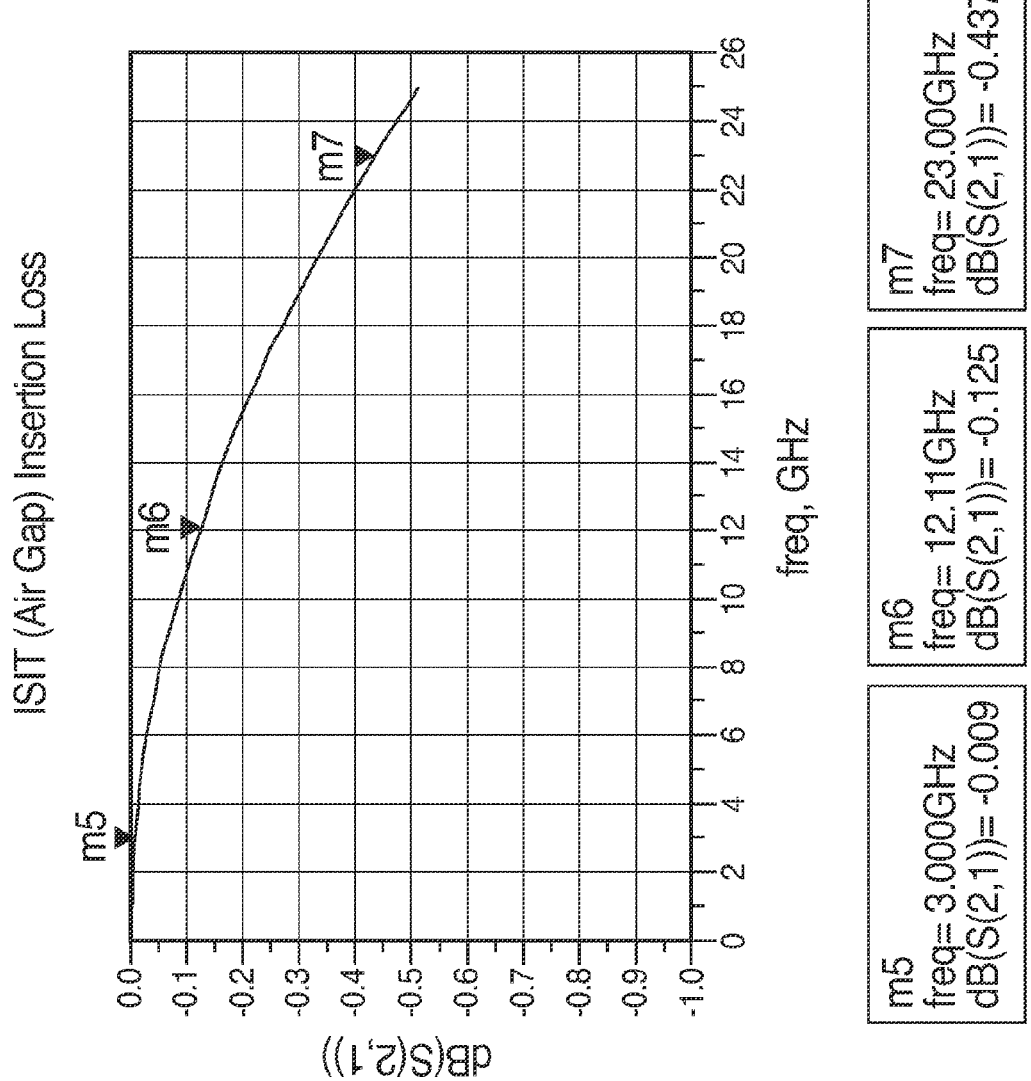
FIG. 8A illustrates a graph of insertion loss of the simulated electromagnetic performance of a first exemplary modeled electromagnetic transition.
Figure 8B:
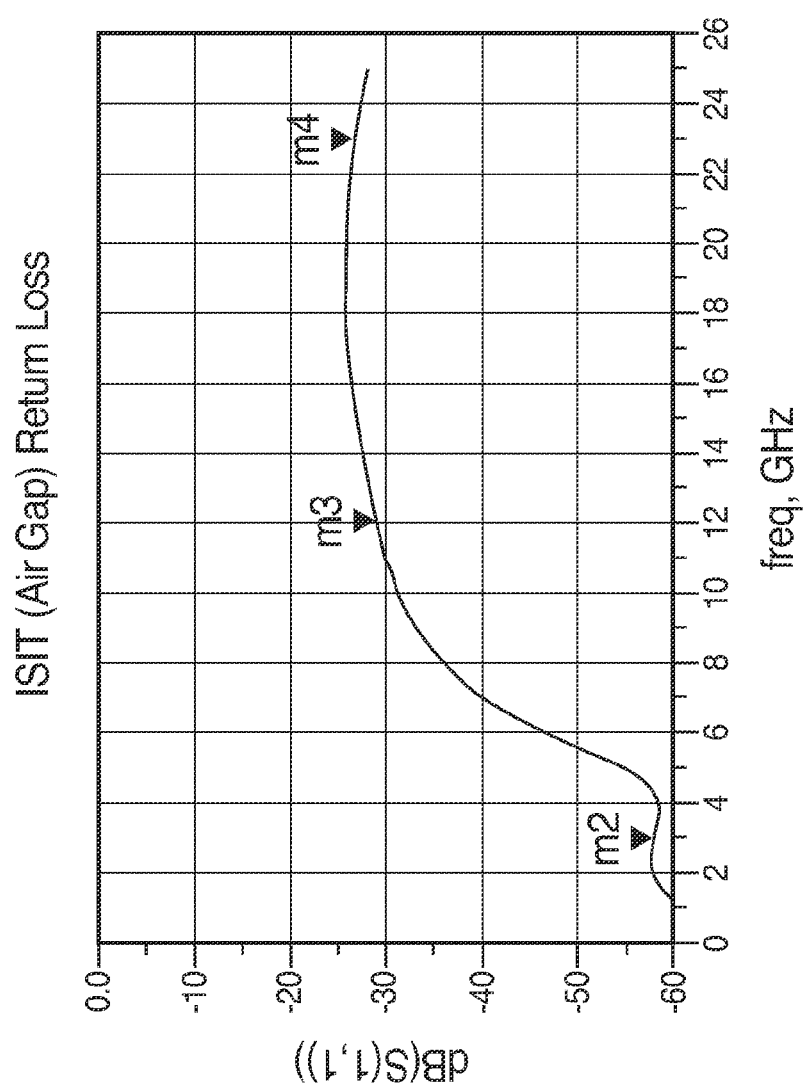
FIG. 8B illustrates a graph of return loss of the simulated electromagnetic performance of the first exemplary modeled electromagnetic transition.
Figure 8C:
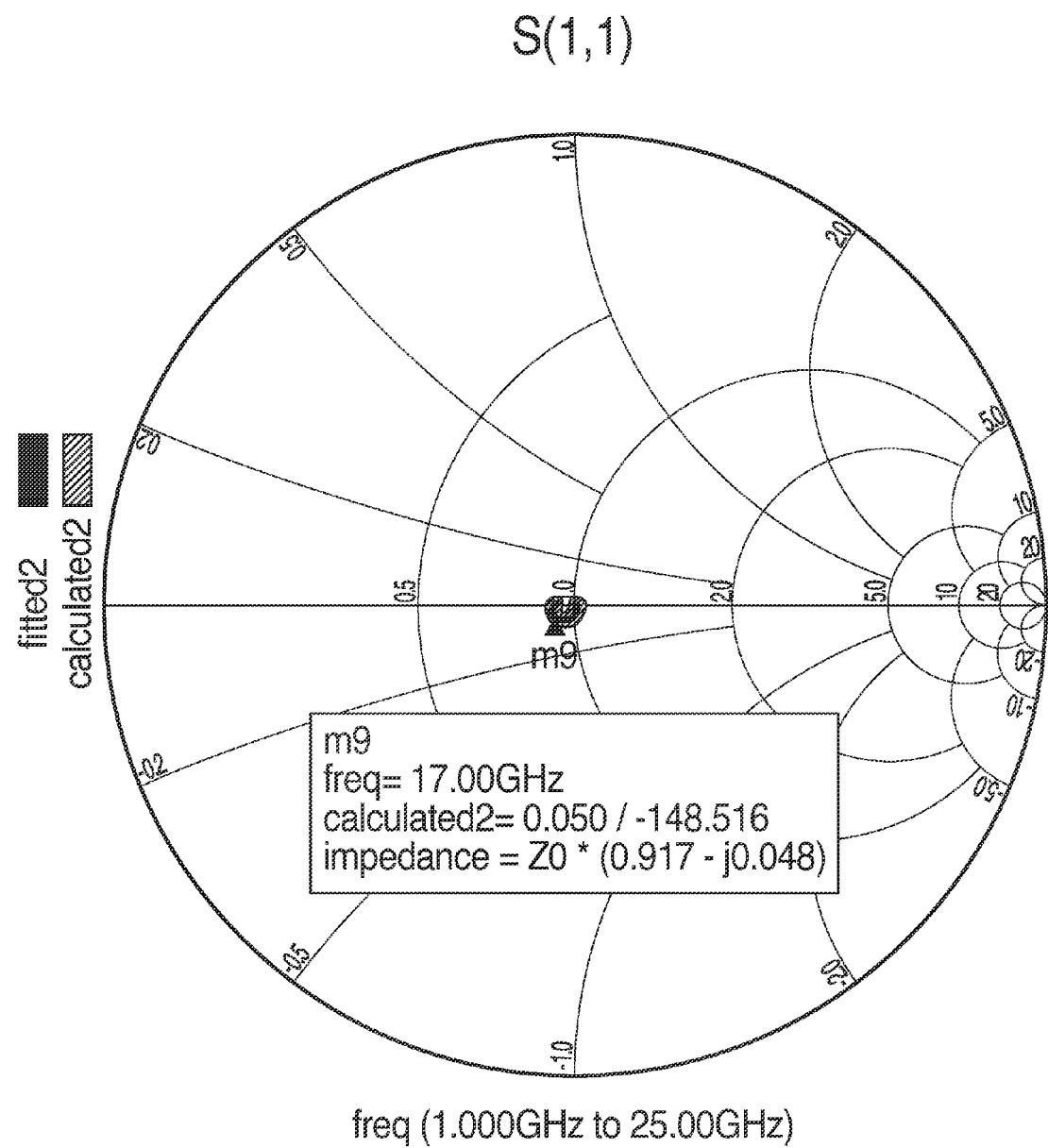
FIG. 8C illustrates an impedance plot of the simulated electromagnetic performance of the first exemplary modeled electromagnetic transition.

FIGS. 8A, 8B and 8C illustrate insertion loss, return loss and impedance plots, respectively, of the simulated electromagnetic performance of the first modeled electromagnetic transition having the first experimental set of properties. The simulated performance shows a return loss of better than −25 dB over a wide range of frequencies. The insertion loss is in the better than 0.2 dB in a frequency range of up to 12 GHz and increases to 0.4 dB at 22 GHz.

Figure 9A:
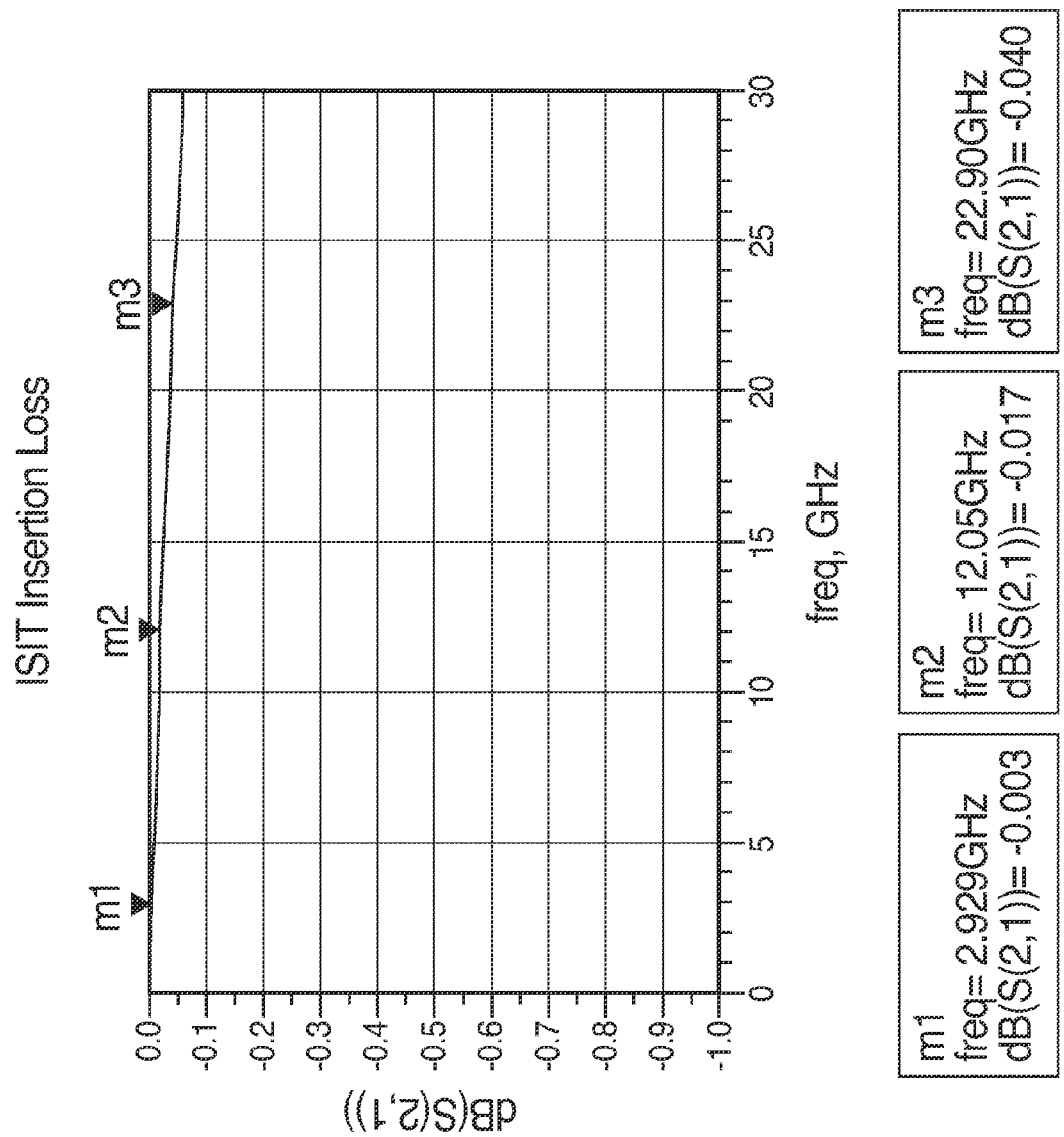
FIG. 9A illustrates a graph of insertion loss of the simulated electromagnetic performance of a second exemplary modeled electromagnetic transition.
Figure 9B:
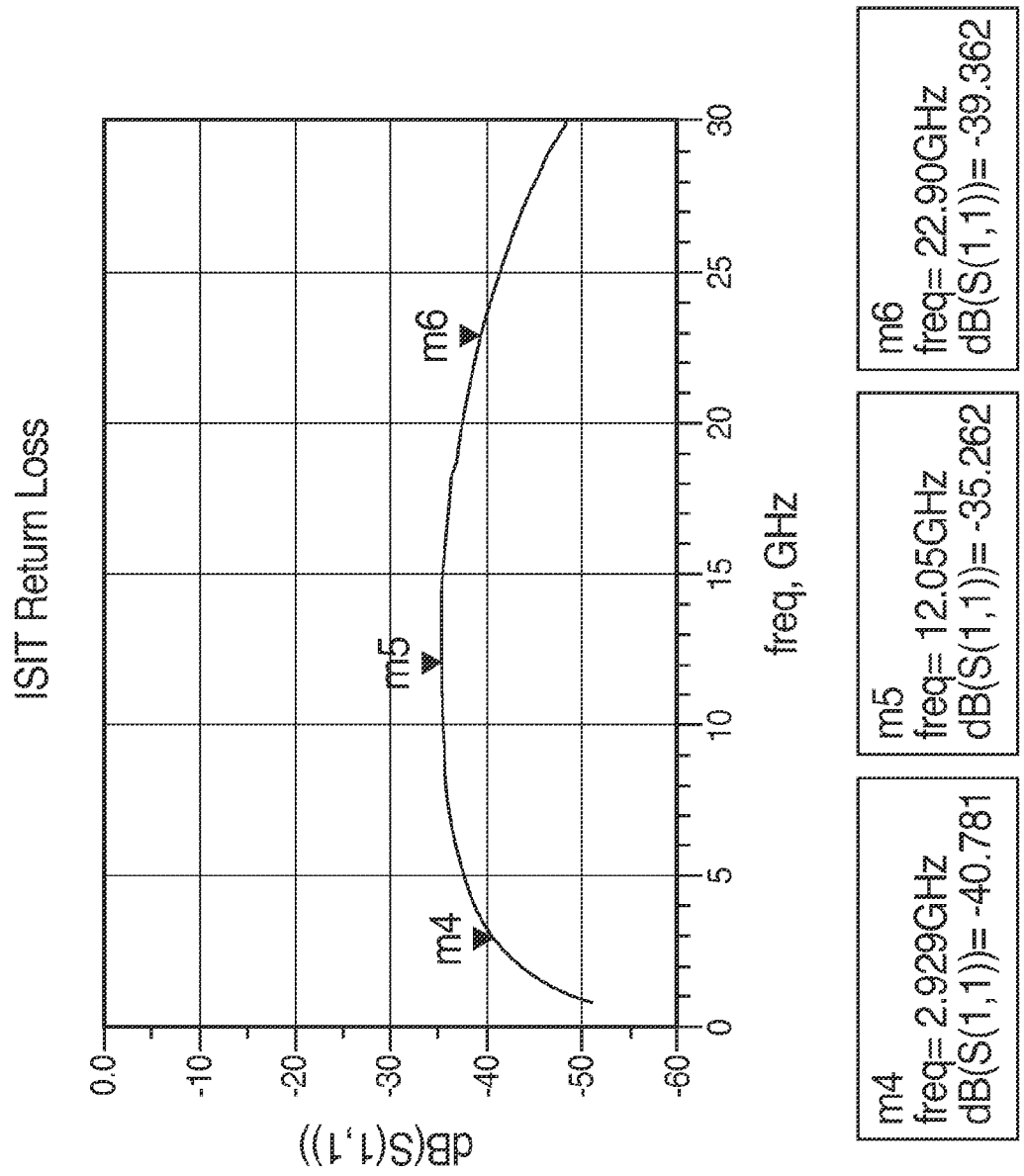
FIG. 9B illustrates a graph of return loss of the simulated electromagnetic performance of the second exemplary modeled electromagnetic transition.
Figure 9C:
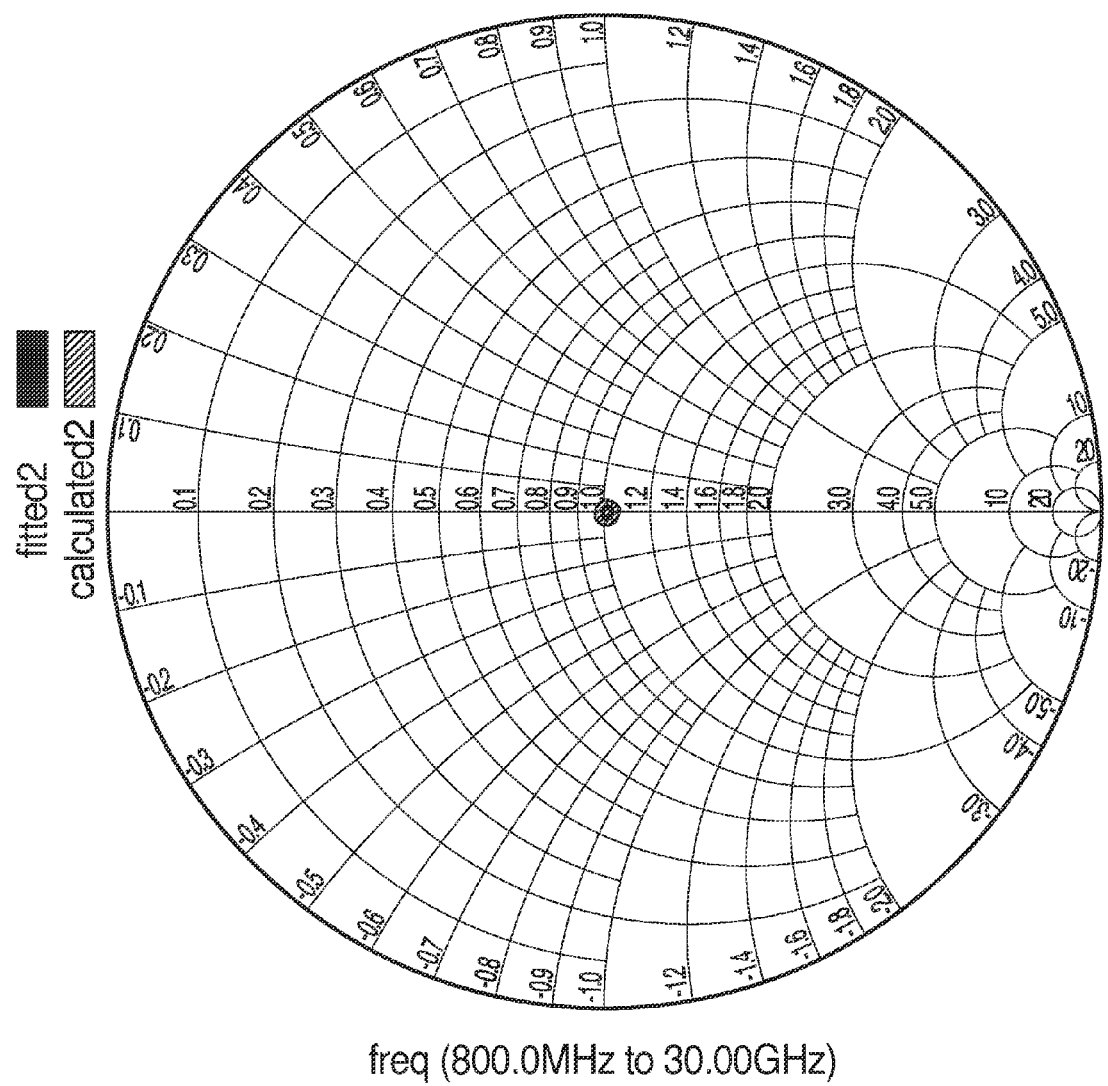
FIG. 9C illustrates an impedance plot of the simulated electromagnetic performance of the second exemplary modeled electromagnetic transition.

FIGS. 9A, 9B and 9C illustrate insertion loss, return loss and impedance plots, respectively, of the simulated electromagnetic performance of the second modeled electromagnetic transition having the second experimental set of properties. The simulated performance shows a return loss of better than −30 dB over a wide range of frequencies. The insertion loss is in the better than 0.1 dB in a wide range of frequencies.

Figure 10A:
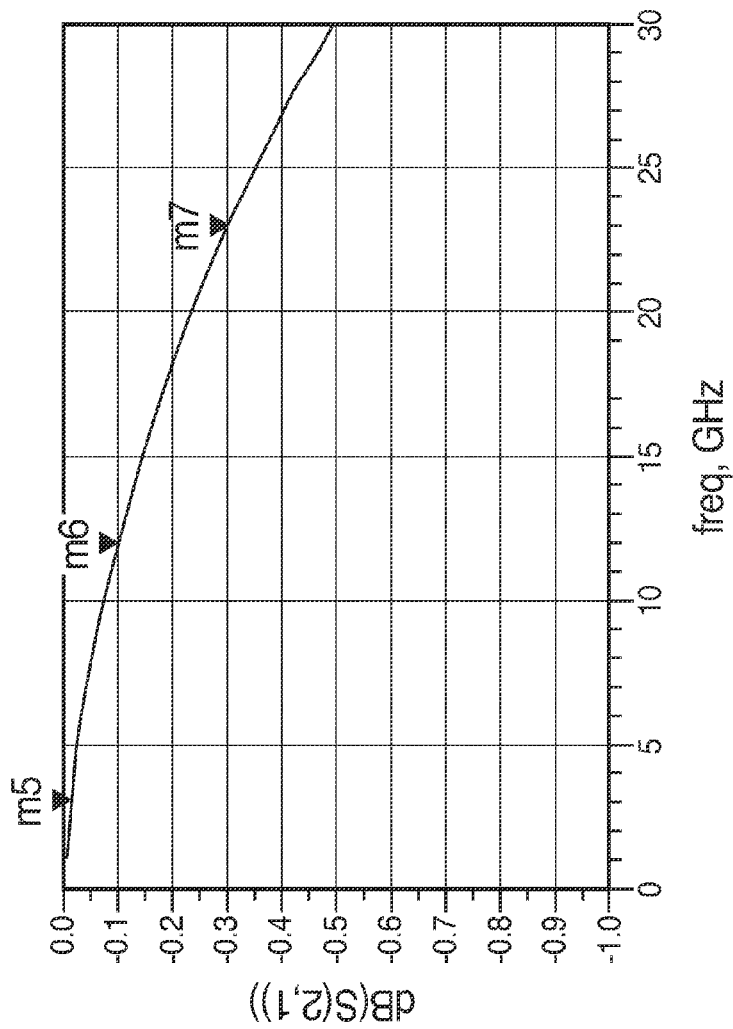
FIG. 10A illustrates a graph of insertion loss of the simulated electromagnetic performance of a third exemplary modeled electromagnetic transition.
Figure 10B:
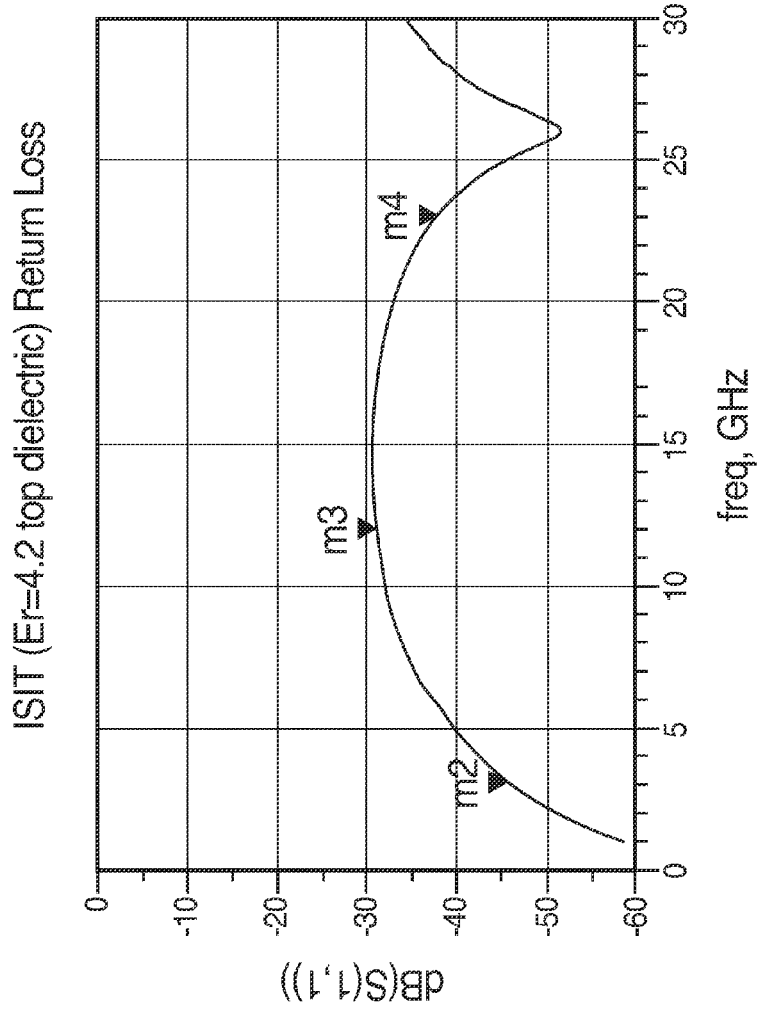
FIG. 10B illustrates a graph of return loss of the simulated electromagnetic performance of the third exemplary modeled electromagnetic transition.
Figure 10C:
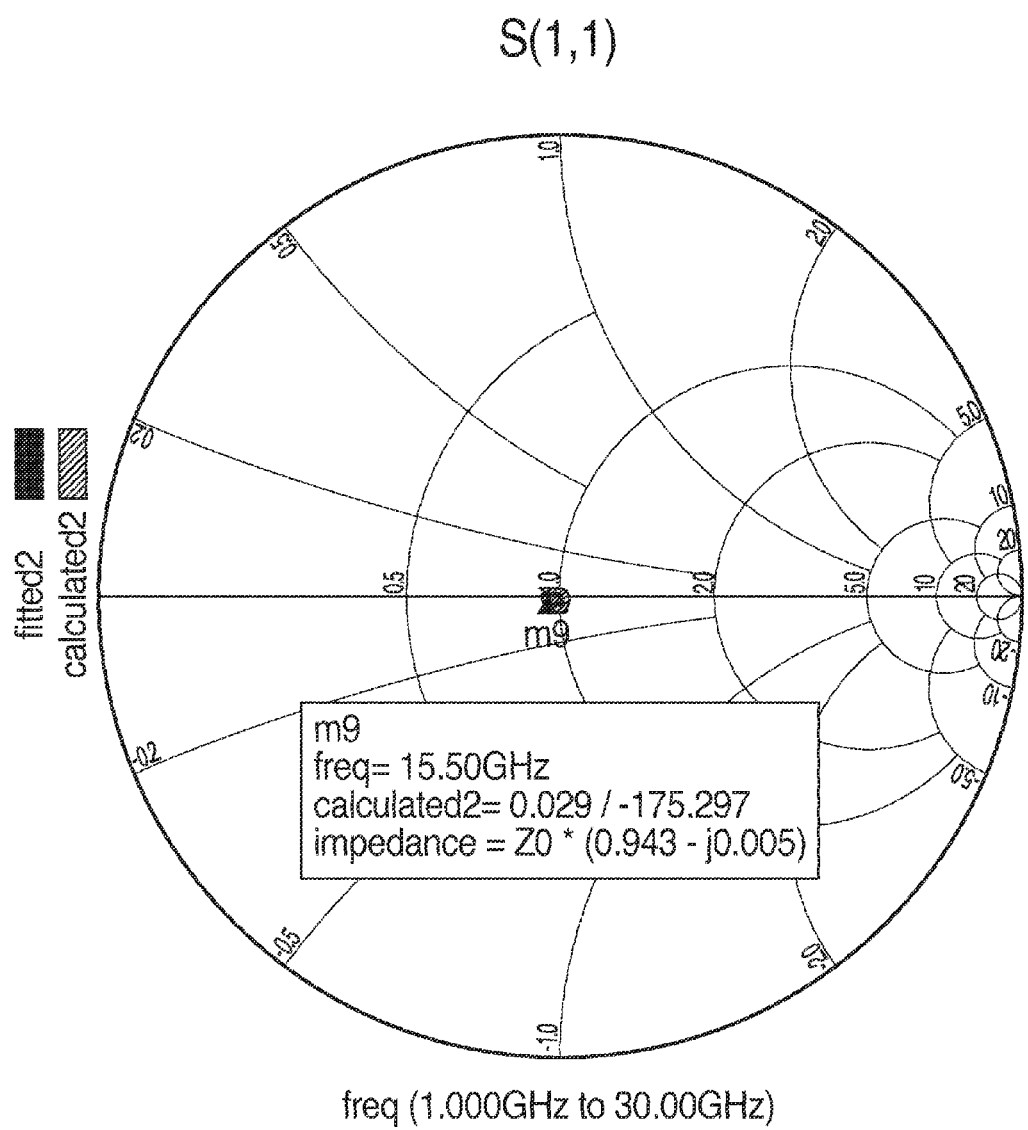
FIG. 10C illustrates an impedance plot of the simulated electromagnetic performance of the third exemplary modeled electromagnetic transition.

FIGS. 10A, 10B and 10C illustrate insertion loss, return loss and impedance plots, respectively, of the simulated electromagnetic performance of the third modeled electromagnetic transition having the third experimental set of properties. The simulated performance shows a return loss of better than −30 dB over a wide range of frequencies. The insertion loss is in the better than 0.2 dB in a frequency range of up to 15 GHz and increases to 0.3 dB at 23 GHz.

Figure 11B:
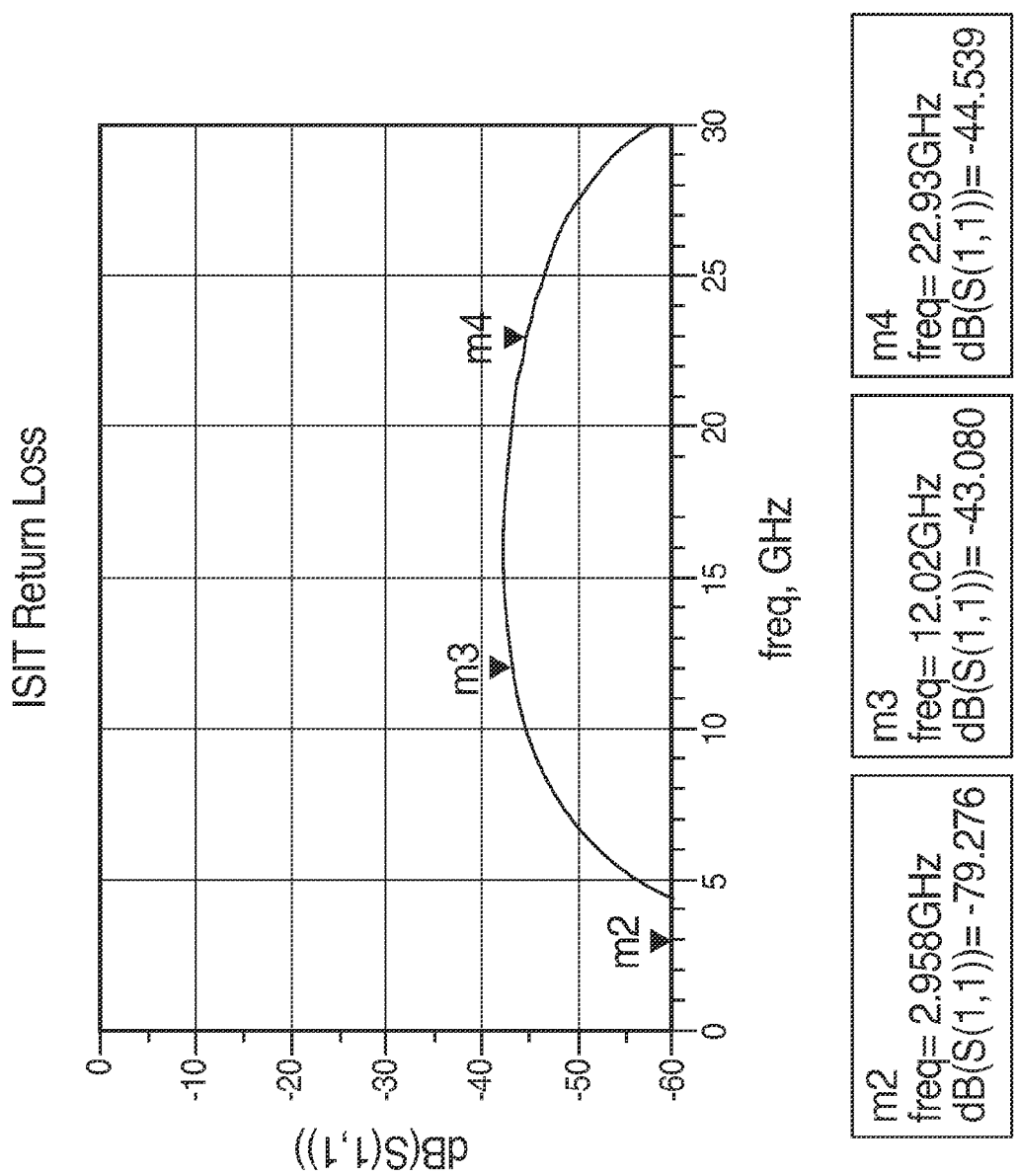
FIG. 11B illustrates a graph of return loss of the simulated electromagnetic performance of the fourth exemplary modeled electromagnetic transition.
Figure 11C:
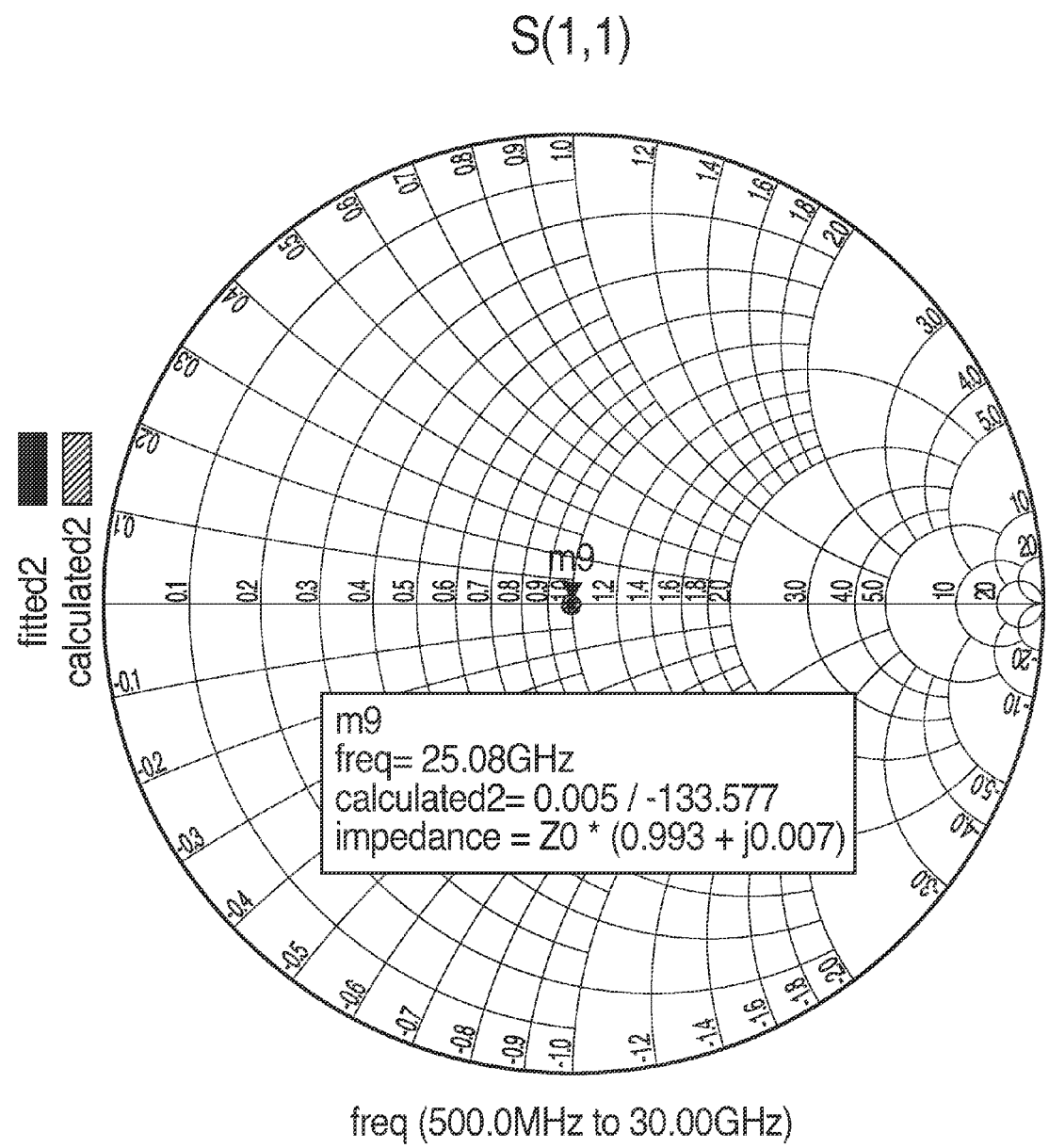
FIG. 11C illustrates an impedance plot of the simulated electromagnetic performance of the fourth exemplary modeled electromagnetic transition.

FIGS. 11A, 11B and 11C illustrate insertion loss, return loss and impedance plots, respectively, of the simulated electromagnetic performance of the fourth modeled electromagnetic transition having the fourth experimental set of properties. The simulated performance shows a return loss of better than −40 dB over a wide range of frequencies. The insertion loss is in the better than 0.02 dB in a wide range of frequencies.

Figure 12A:
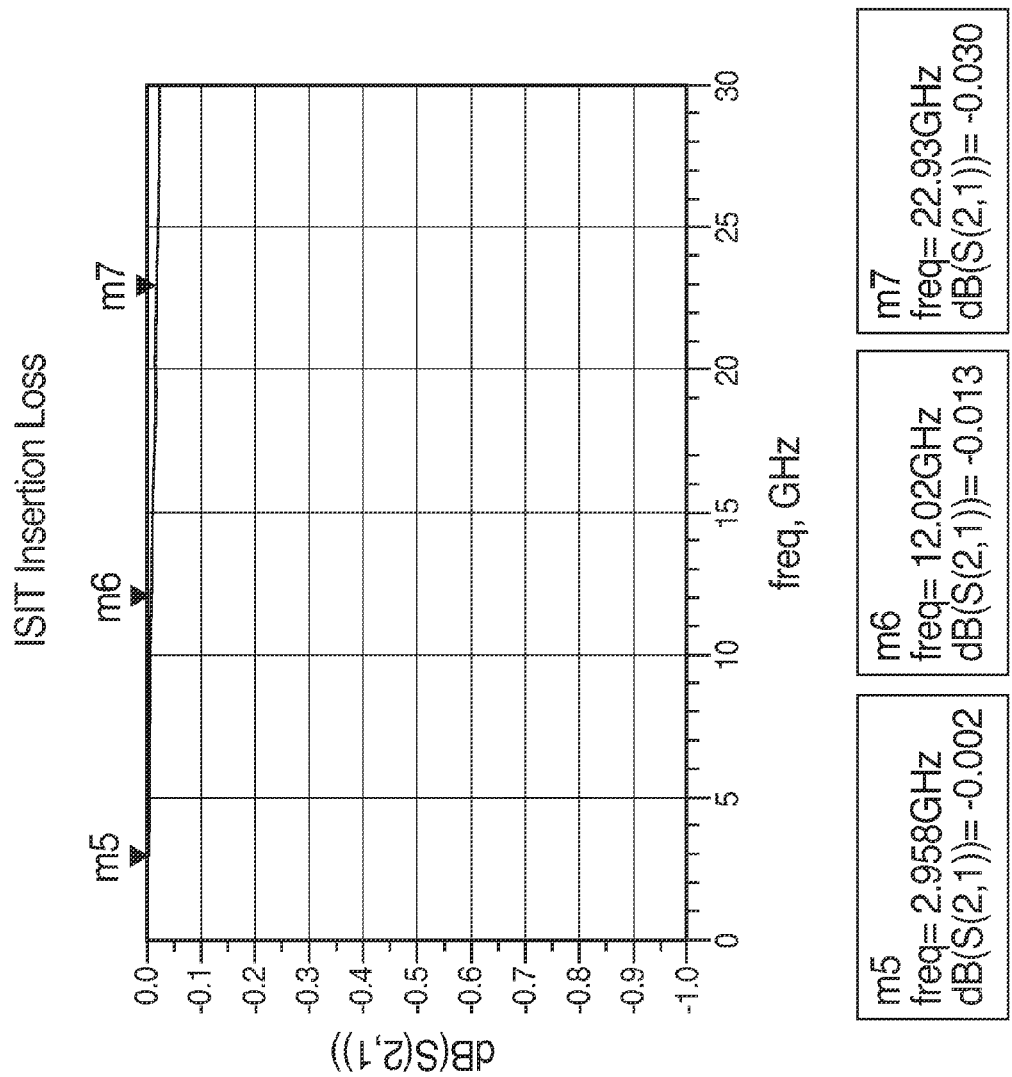
FIG. 12A illustrates a graph of insertion loss of the simulated electromagnetic performance of a fifth exemplary modeled electromagnetic transition.
Figure 12B:
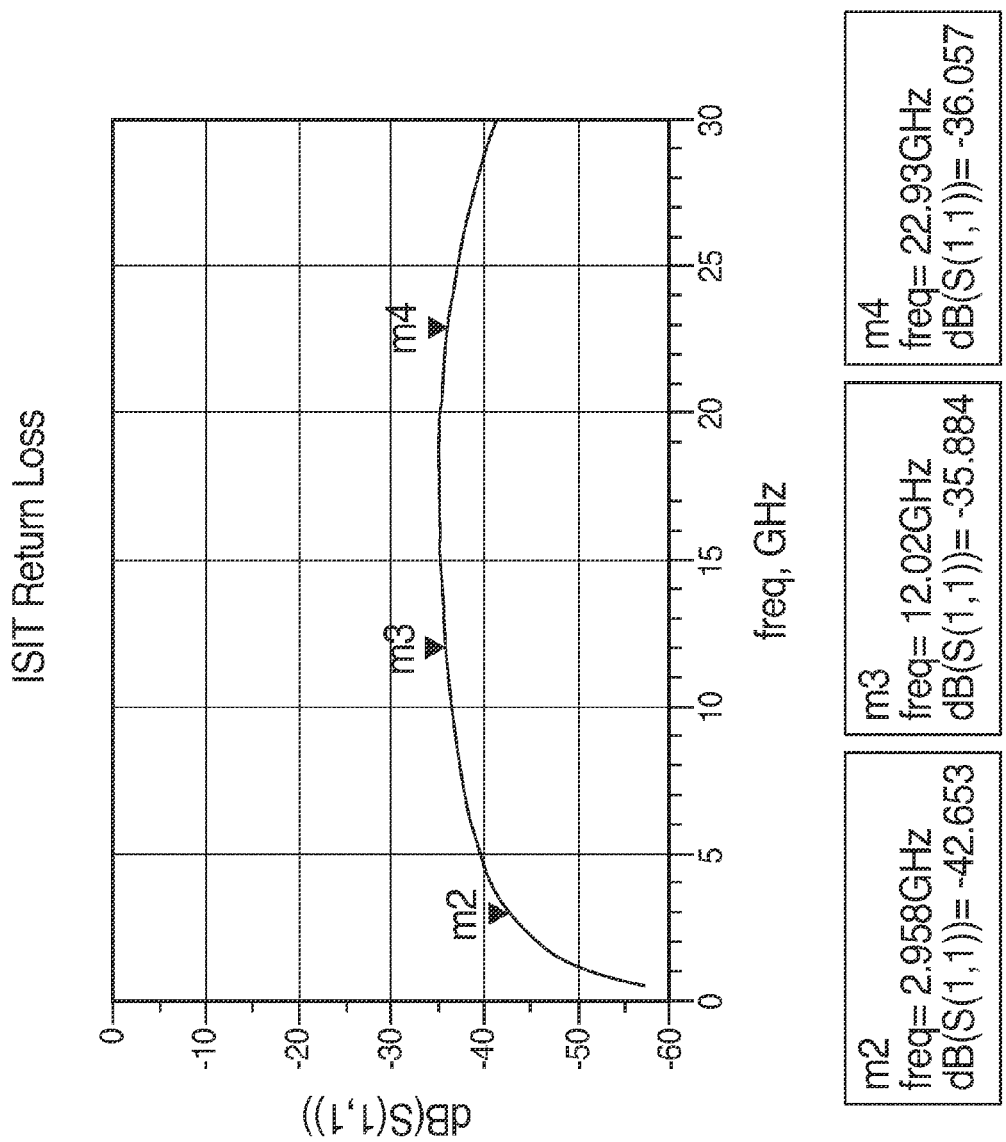
FIG. 12B illustrates a graph of return loss of the simulated electromagnetic performance of the fifth exemplary modeled electromagnetic transition.
Figure 12C:
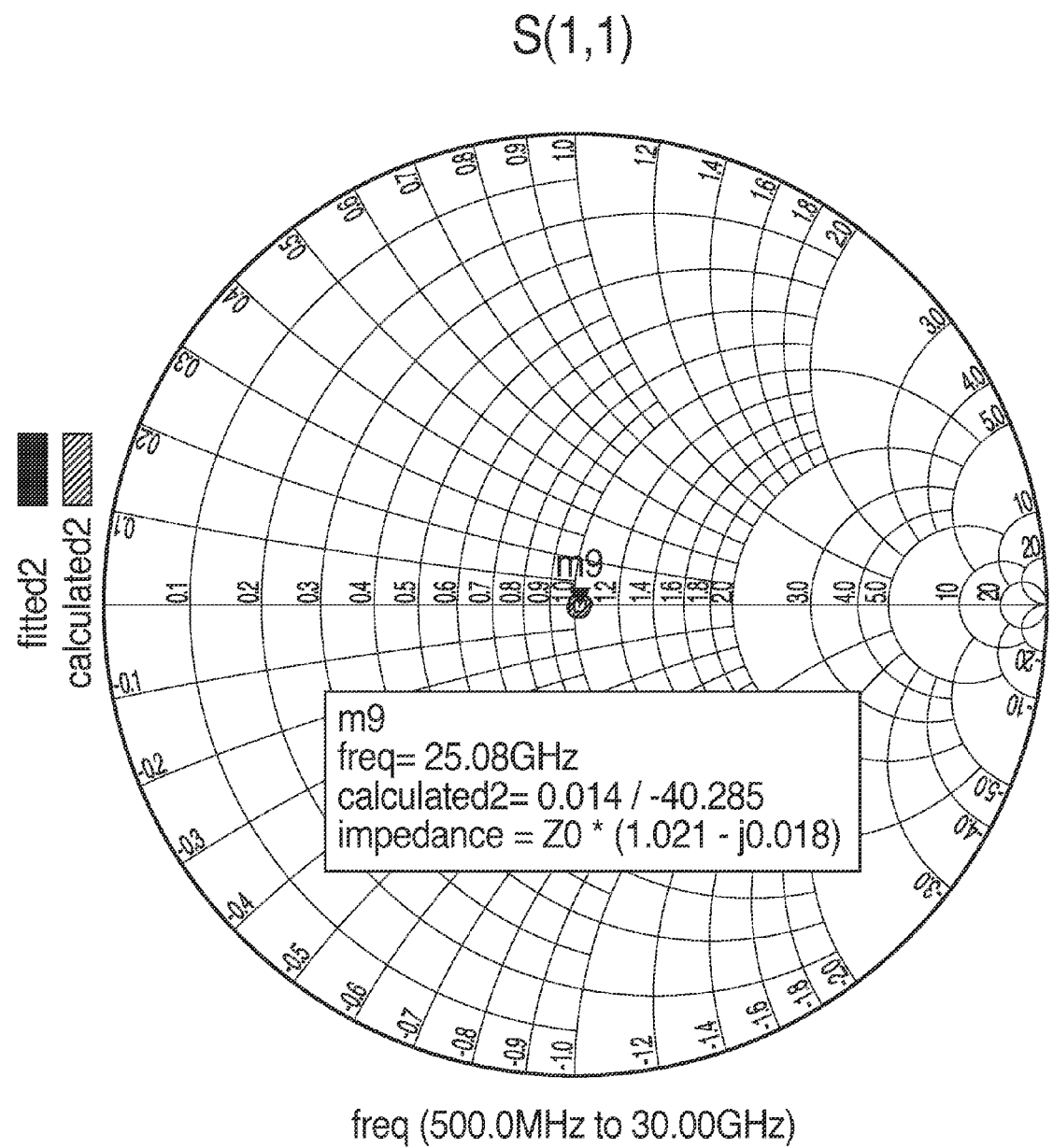
FIG. 12C illustrates a an impedance plot of the simulated electromagnetic performance of the fifth exemplary modeled electromagnetic transition.

FIGS. 12A, 12B and 12C illustrate insertion loss, return loss and impedance plots, respectively, of the simulated electromagnetic performance of the fifth modeled electromagnetic transition having the fifth experimental set of properties. The simulated performance shows a return loss of better than −30 dB over a wide range of frequencies. The insertion loss is in the better than 0.03 dB over a wide range of frequencies.

Figure 13:
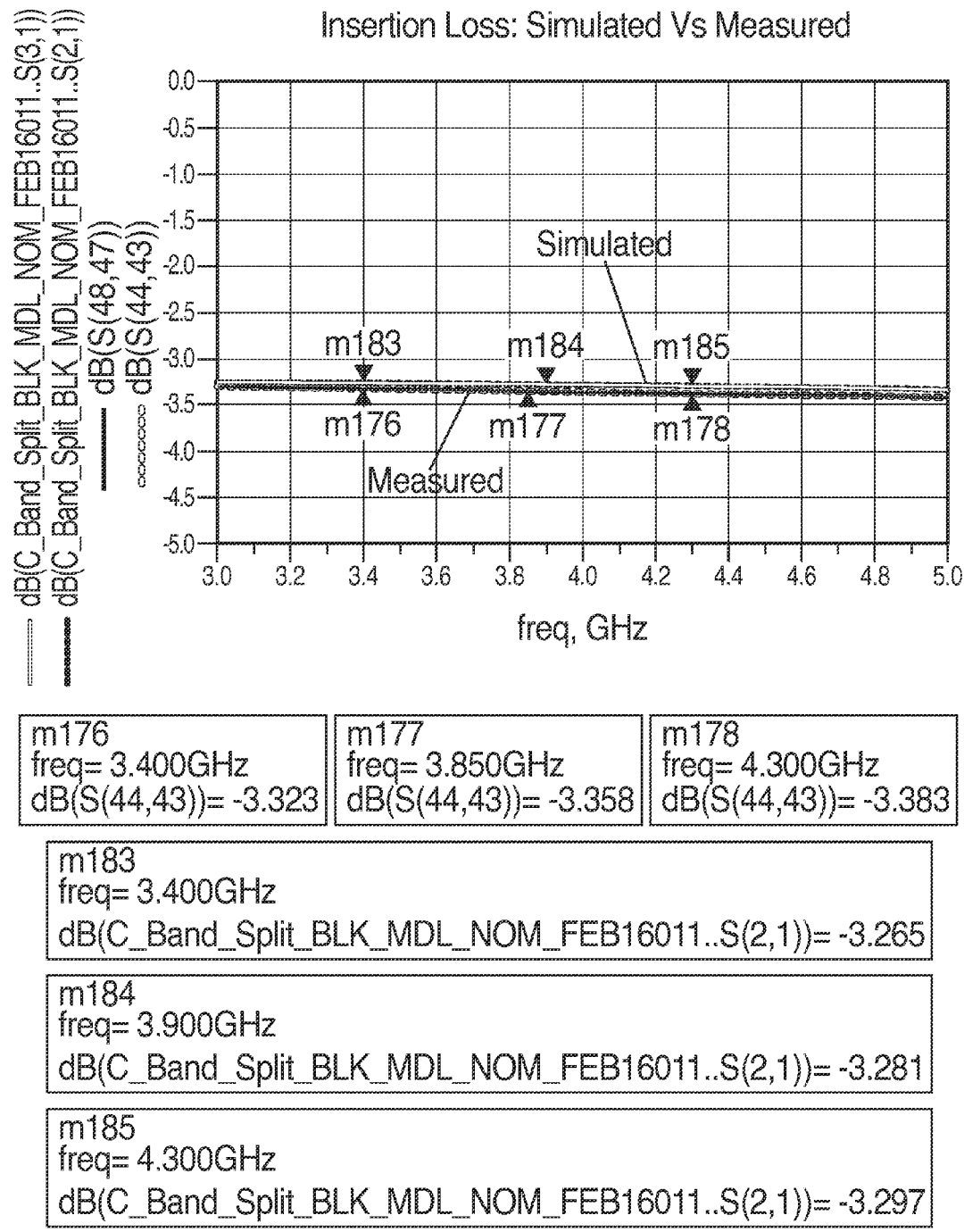
FIG. 13 illustrates a graph of insertion loss of simulated electromagnetic performance of a first modeled exemplary electromagnetic transition and a measured electromagnetic performance of a first exemplary physical electromagnetic transition being applied to the input and output ports of an exemplary C band Wilkinson power divider.

FIG. 13 illustrates insertion loss plots of the simulated electromagnetic performance of the first modeled electromagnetic transition and a measured electromagnetic performance of a first physical electromagnetic transition fabricated according to the first experimental set of properties being applied to the input and output ports of a C band Wilkinson power divider. It will be appreciated that the measured insertion loss of the fabricated cascaded Wilkinson power divider and electromagnetic transition substantially corresponds to the simulated insertion loss of the modeled Wilkinson power divider and electromagnetic transition.

Figure 14:
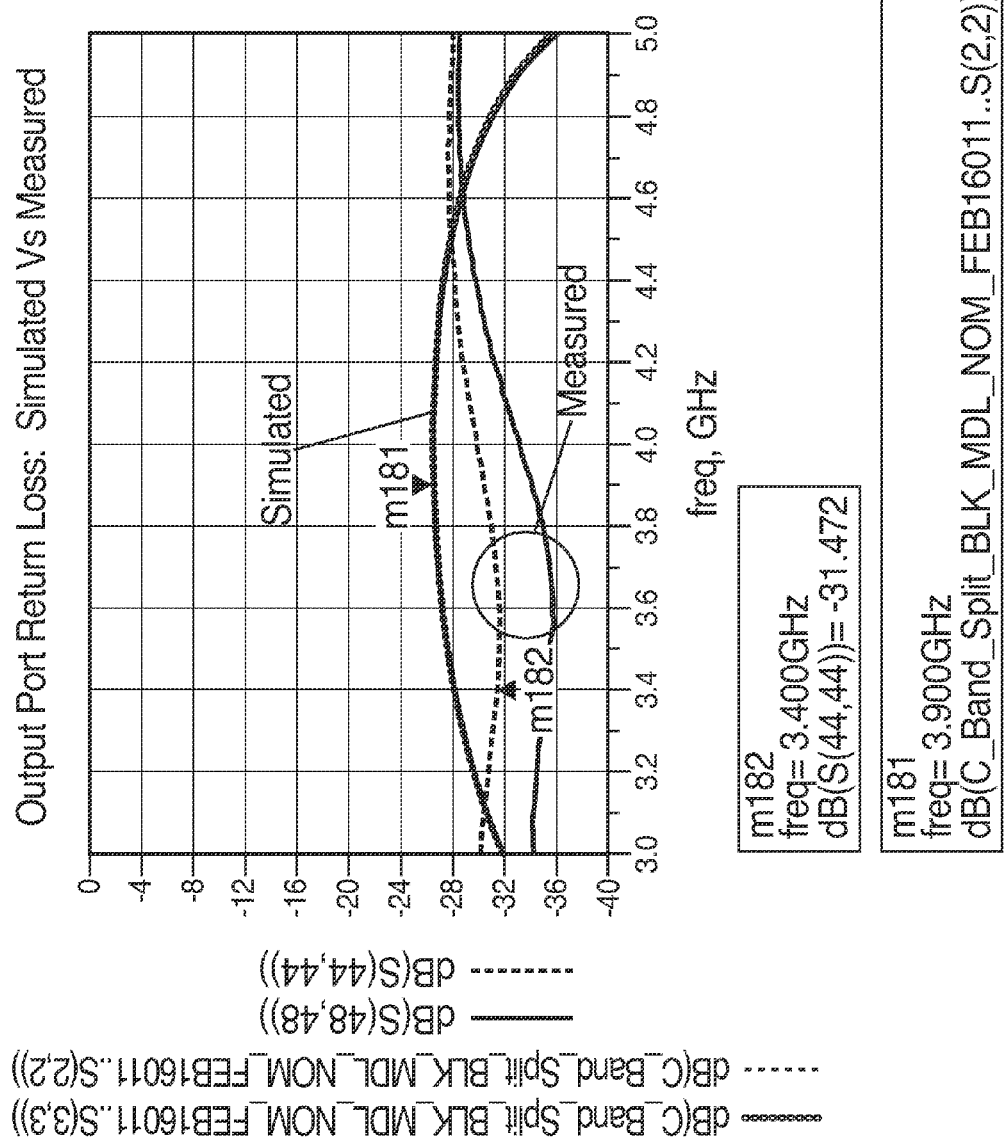
FIG. 14 illustrates a graph of output port return loss of simulated electromagnetic performance of the first modeled exemplary electromagnetic transition and the measured electromagnetic performance of a first exemplary physical electromagnetic transition being applied to the input and output ports of an exemplary C band Wilkinson power divider.

FIG. 14 illustrates output port return loss plots of the simulated electromagnetic performance of the first modeled electromagnetic transition and a measured electromagnetic performance of a first physical electromagnetic transition fabricated according to the first experimental set of properties being applied to the input and output ports of a C band Wilkinson power divider. It will be appreciated that the measured output port return loss of the fabricated cascaded Wilkinson power divider and electromagnetic transition is lower (better) than the corresponding simulated return loss of the modeled Wilkinson power divider and electromagnetic transition in a wide range of frequencies.

Figure 15:
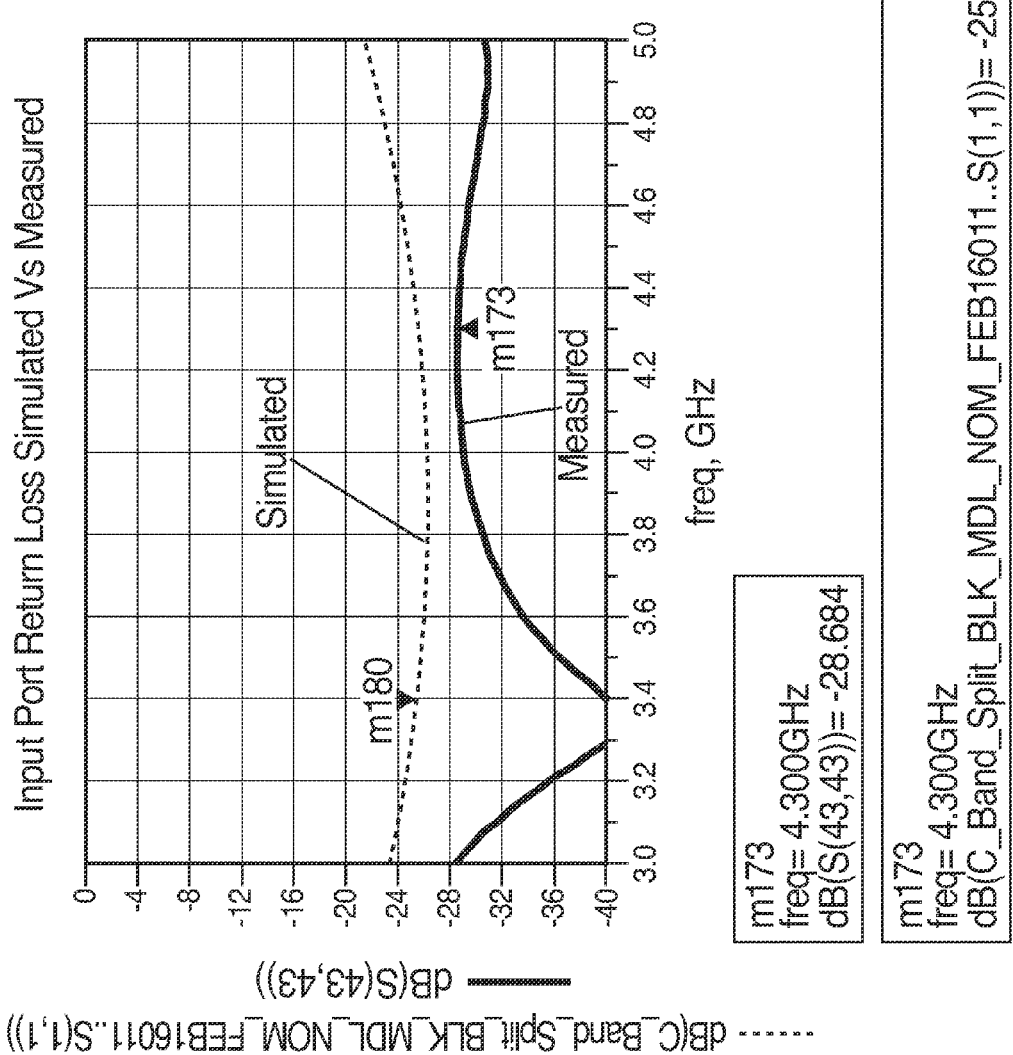
FIG. 15 illustrates a graph of input port return loss of simulated electromagnetic performance of the first modeled exemplary electromagnetic transition and the measured electromagnetic performance of a first exemplary physical electromagnetic transition being applied to the input and output ports of an exemplary C band Wilkinson power divider.

FIG. 15 illustrates input port return loss plots of the simulated electromagnetic performance of the first modeled electromagnetic transition and a measured electromagnetic performance of a first physical electromagnetic transition fabricated according to the first experimental set of properties being applied to the input and output ports of a C band Wilkinson power divider. It will be appreciated that the measured input port return loss of the fabricated cascaded Wilkinson power divider and electromagnetic transition is lower (better) than the corresponding simulated return loss of the modeled electromagnetic transition.

Figure 16:
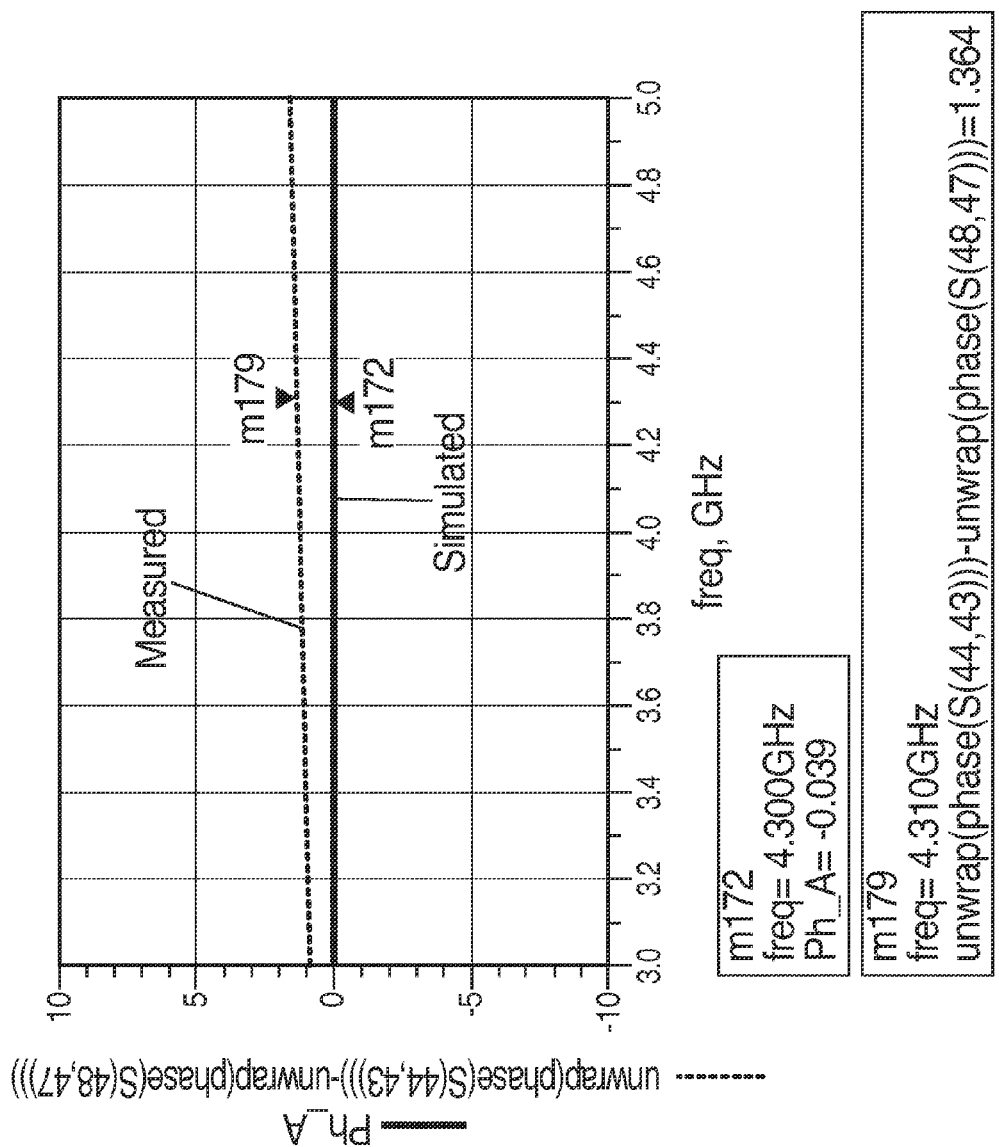
FIG. 16 illustrates a graph of phase balance of simulated electromagnetic performance of the first modeled exemplary electromagnetic transition and the measured electromagnetic performance of a first exemplary physical electromagnetic transition being applied to the input and output ports of an exemplary C band Wilkinson power divider.

FIG. 16 illustrates phase balance plots of the simulated electromagnetic performance of the first modeled electromagnetic transition and a measured electromagnetic performance of a first physical electromagnetic transition fabricated according to the first experimental set of properties being applied to the input and output ports of a C band Wilkinson power divider.

Figure 17:
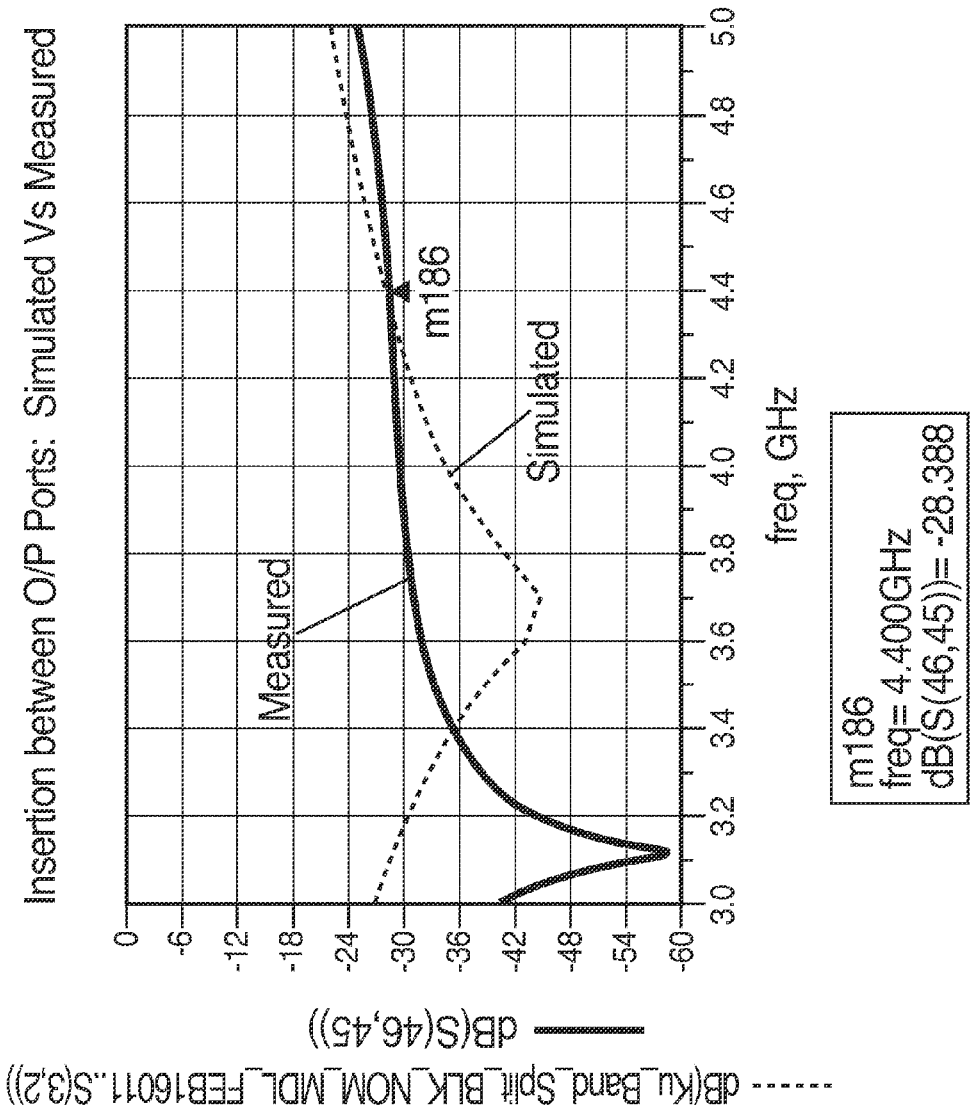
FIG. 17 illustrates a graph of isolation of simulated electromagnetic performance of the first modeled exemplary electromagnetic transition and the measured electromagnetic performance of a first exemplary physical electromagnetic transition being applied to the input and output ports of an exemplary C band Wilkinson power divider.

FIG. 17 illustrates isolation plots of the simulated electromagnetic performance of the first modeled electromagnetic transition and a measured electromagnetic performance of a first physical electromagnetic transition fabricated according to the first experimental set of properties being applied to the input and output ports of a C band Wilkinson power divider.

Figure 18:
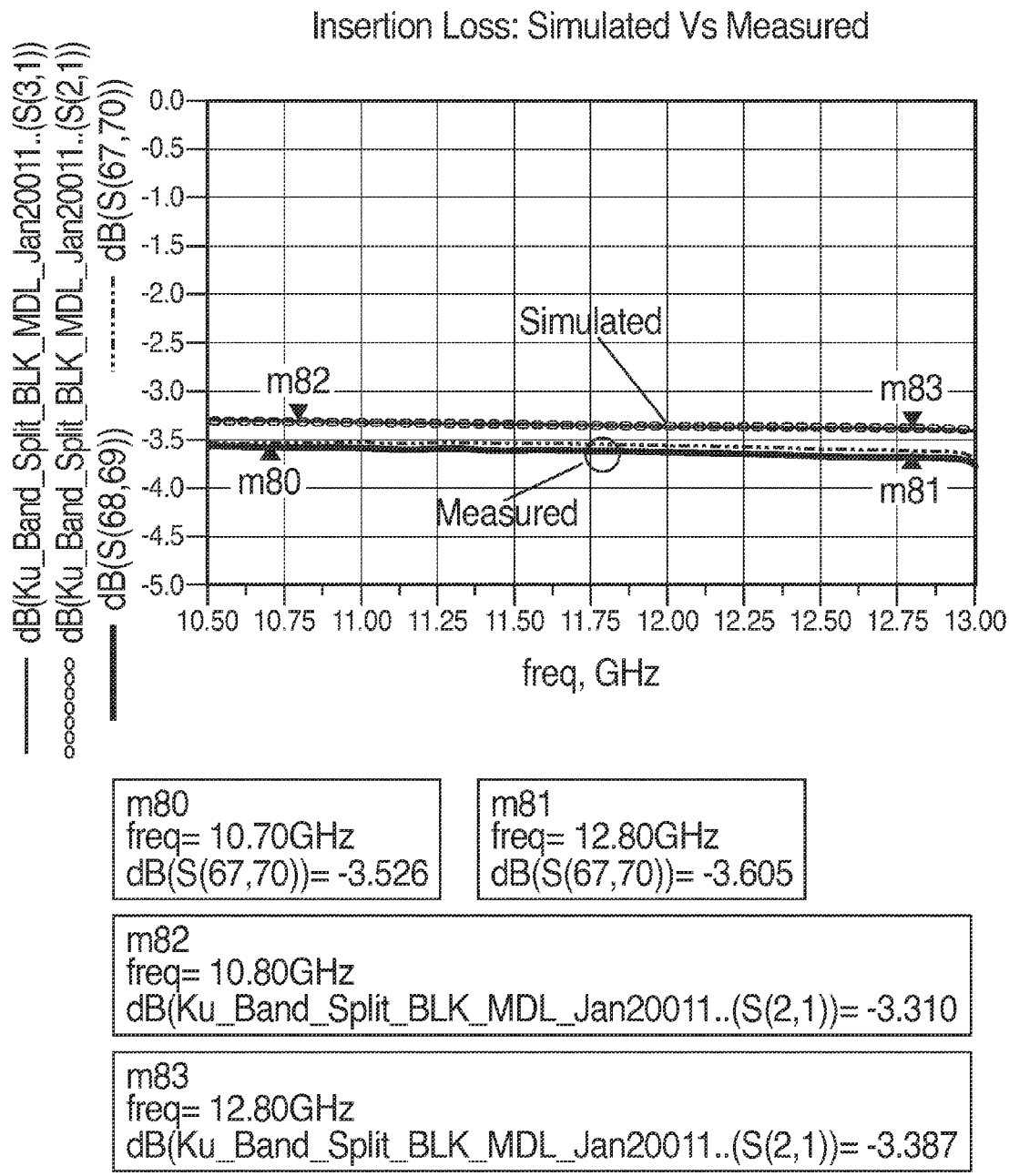
FIG. 18 illustrates a graph of insertion loss of simulated electromagnetic performance of the first modeled exemplary electromagnetic transition and the measured electromagnetic performance of a first exemplary physical electromagnetic transition.

FIG. 18 illustrates isolation plots of the simulated electromagnetic performance of the first modeled electromagnetic transition and a measured electromagnetic performance of a first physical electromagnetic transition fabricated according to the first experimental set of properties being applied to the input and output ports of a Ku band Wilkinson power divider.

Figure 19:
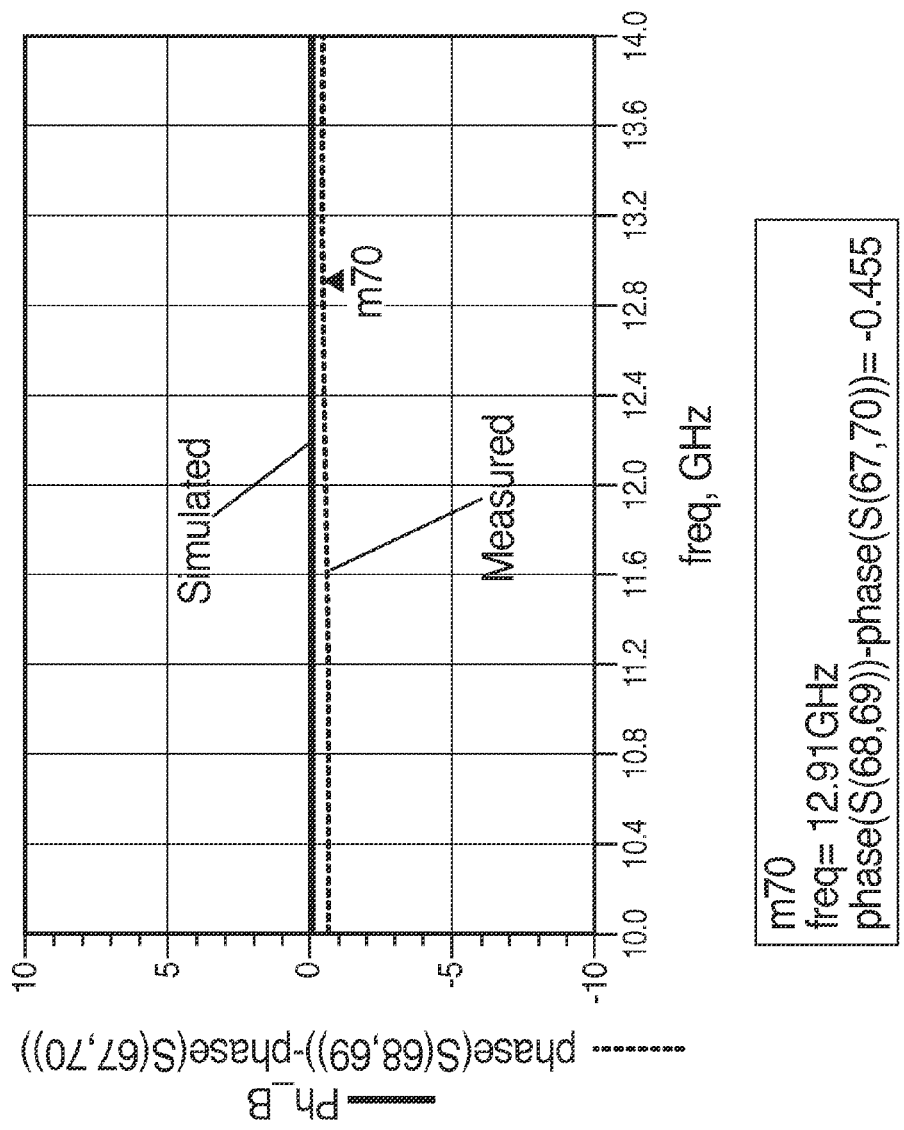
FIG. 19 illustrates a graph of phase balance of simulated electromagnetic performance of the first modeled exemplary electromagnetic transition and the measured electromagnetic performance of a first exemplary physical electromagnetic transition being applied to the input and output ports of an exemplary Ku band Wilkinson power divider.

FIG. 19 illustrates phase balance plots of the simulated electromagnetic performance of the first modeled electromagnetic transition and a measured electromagnetic performance of a first physical electromagnetic transition fabricated according to the first experimental set of properties being applied to the input and output ports of a Ku band Wilkinson power divider.

Figure 20:
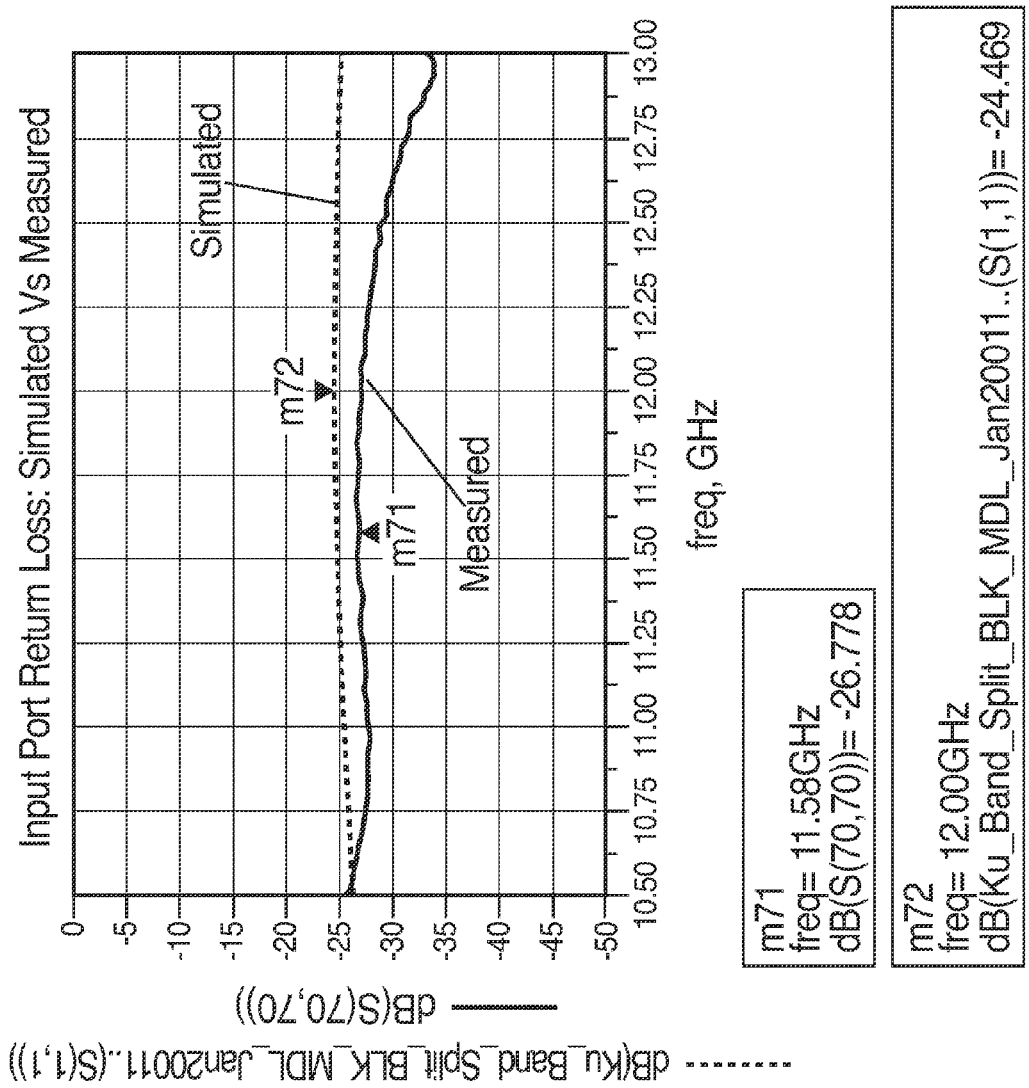
FIG. 20 illustrates a graph of input port return loss of simulated electromagnetic performance of the first modeled exemplary electromagnetic transition and the measured electromagnetic performance of a first exemplary physical electromagnetic transition being applied to the input and output ports of an exemplary Ku band Wilkinson power divider.

FIG. 20 illustrates input port return loss plots of the simulated electromagnetic performance of the first modeled electromagnetic transition and a measured electromagnetic performance of a first physical electromagnetic transition fabricated according to the first experimental set of properties being applied to the input and output ports of a Ku band Wilkinson power divider. It will be appreciated that the measured input port return loss of the fabricated cascaded Wilkinson power divider and electromagnetic transition is lower (better) than the corresponding simulated return loss of the modeled electromagnetic transition.

Figure 21:
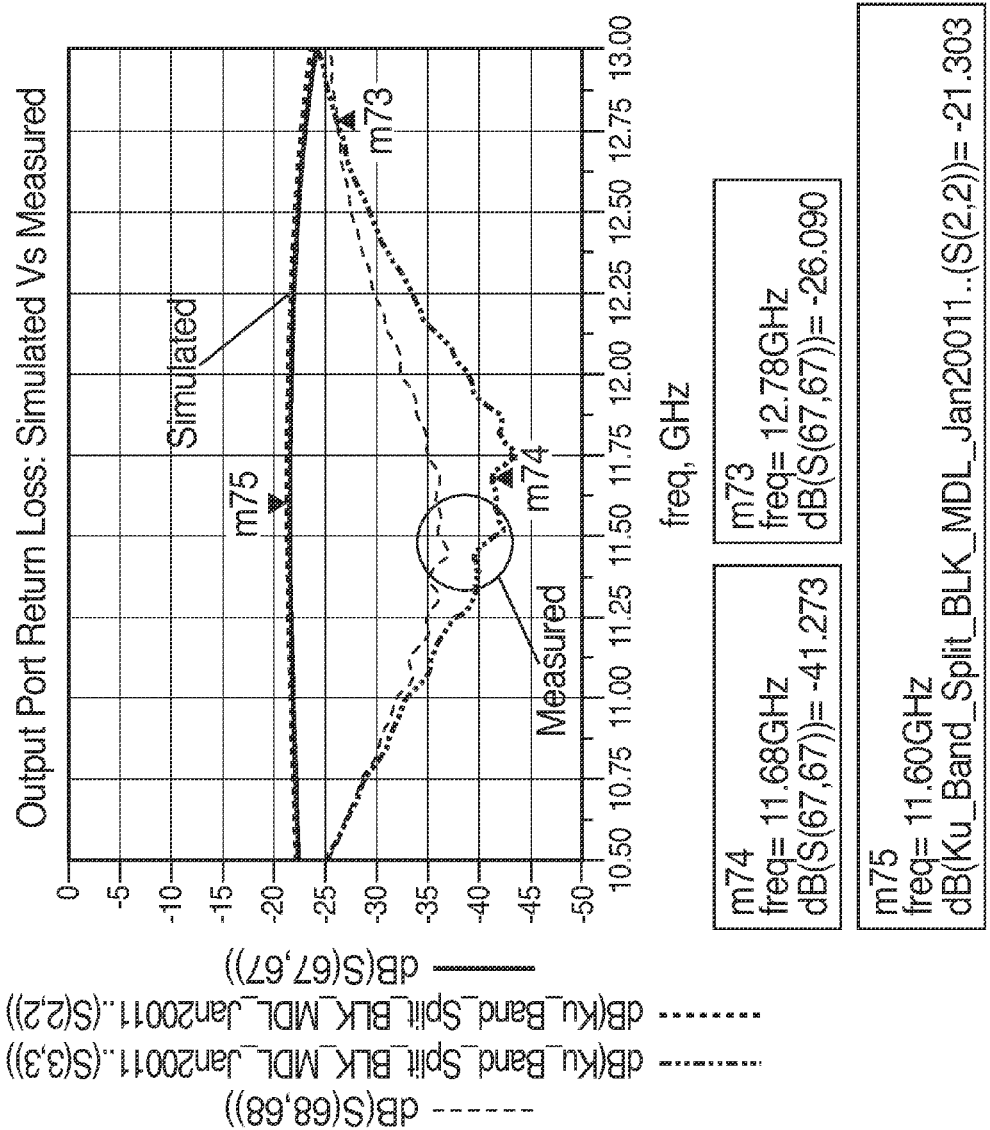
FIG. 21 illustrates a graph of output port return loss of simulated electromagnetic performance of the first modeled exemplary electromagnetic transition and the measured electromagnetic performance of a first exemplary physical electromagnetic transition being applied to the input and output ports of an exemplary Ku band Wilkinson power divider.

FIG. 21 illustrates output port return loss plots of the simulated electromagnetic performance of the first modeled electromagnetic transition and a measured electromagnetic performance of a first physical electromagnetic transition fabricated according to the first experimental set of properties being applied to the input and output ports of a Ku band Wilkinson power divider. It will be appreciated that the measured output port return loss of the fabricated cascaded Wilkinson power divider and electromagnetic transition is lower (better) than the corresponding simulated return loss of the modeled electromagnetic transition.

Figure 22:
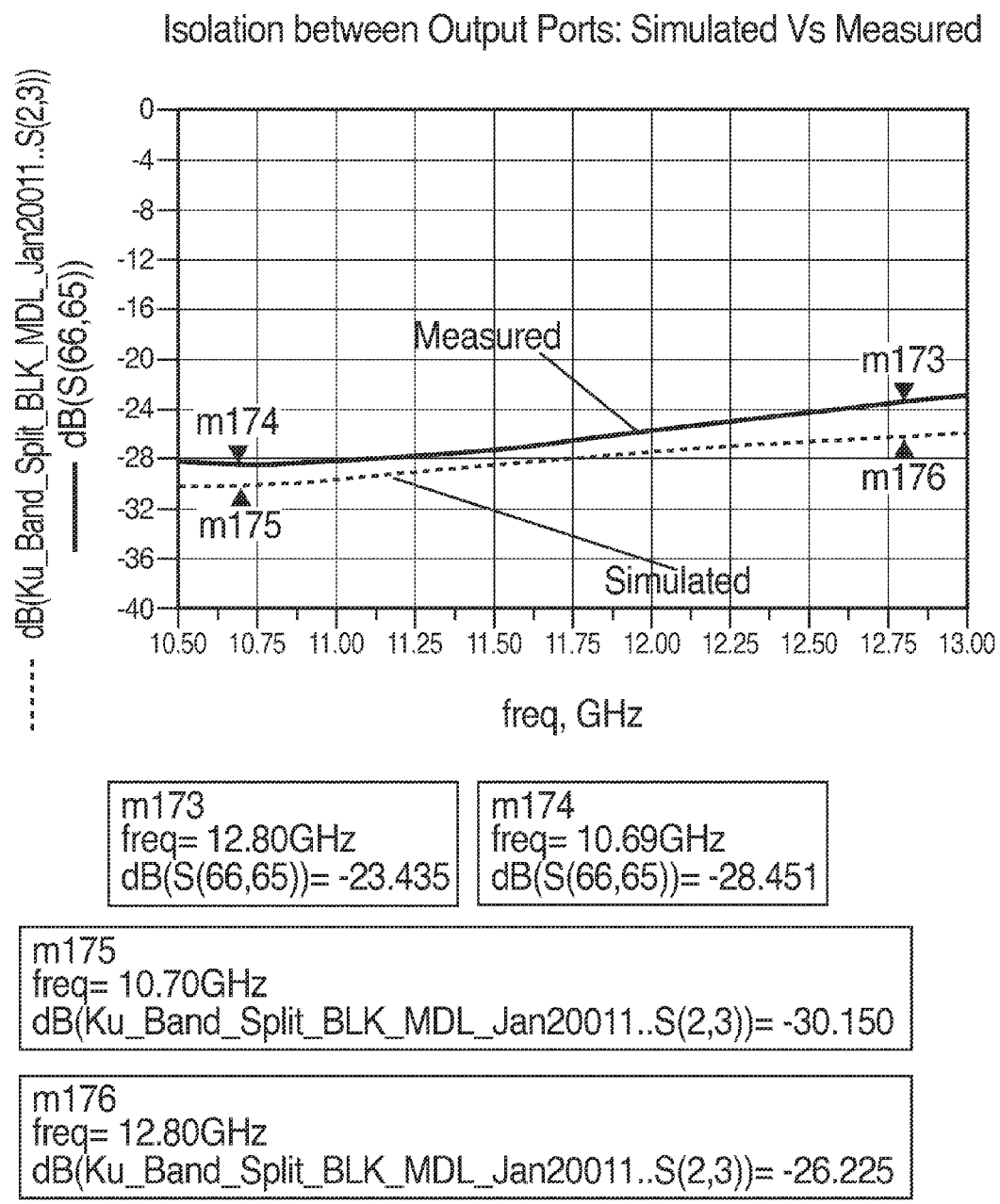
FIG. 22 illustrates a graph of isolation of simulated electromagnetic performance of the first modeled exemplary electromagnetic transition and the measured electromagnetic performance of a first exemplary physical electromagnetic transition being applied to the input and output ports of an exemplary Ku band Wilkinson power divider.

FIG. 22 illustrates isolation plots of the simulated electromagnetic performance of the first modeled electromagnetic transition and a measured electromagnetic performance of a first physical electromagnetic transition fabricated according to the first experimental set of properties being applied to the input and output ports of a Ku band Wilkinson power divider.

Figure 23:
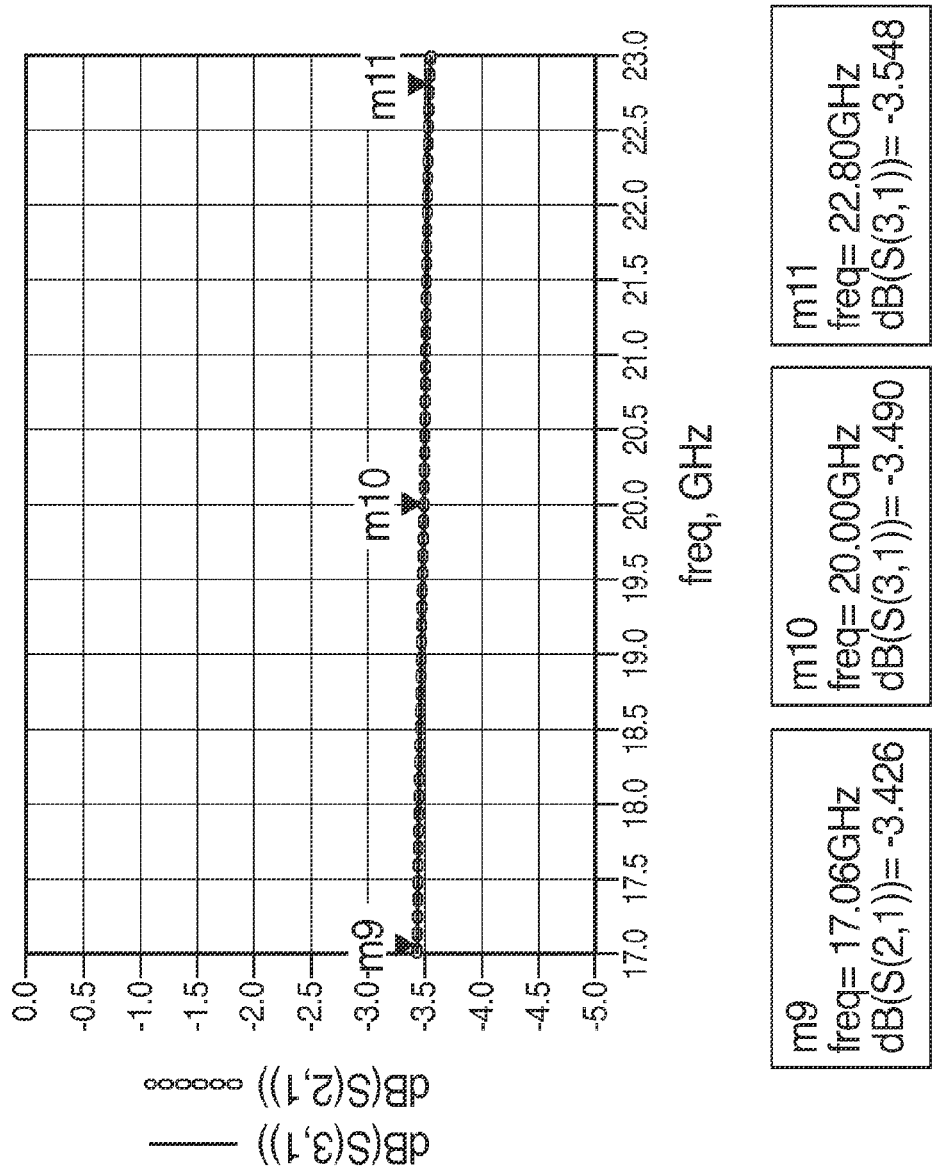
FIG. 23 illustrates a graph of insertion loss of simulated electromagnetic performance of a modeled exemplary K-band 2 way Wilkinson stripline power divider.

FIG. 23 illustrates insertion loss plot of the simulated electromagnetic performance of a modeled K band 2 way Wilkinson stripline power divider having the third modeled electromagnetic transitions.

Figure 24:
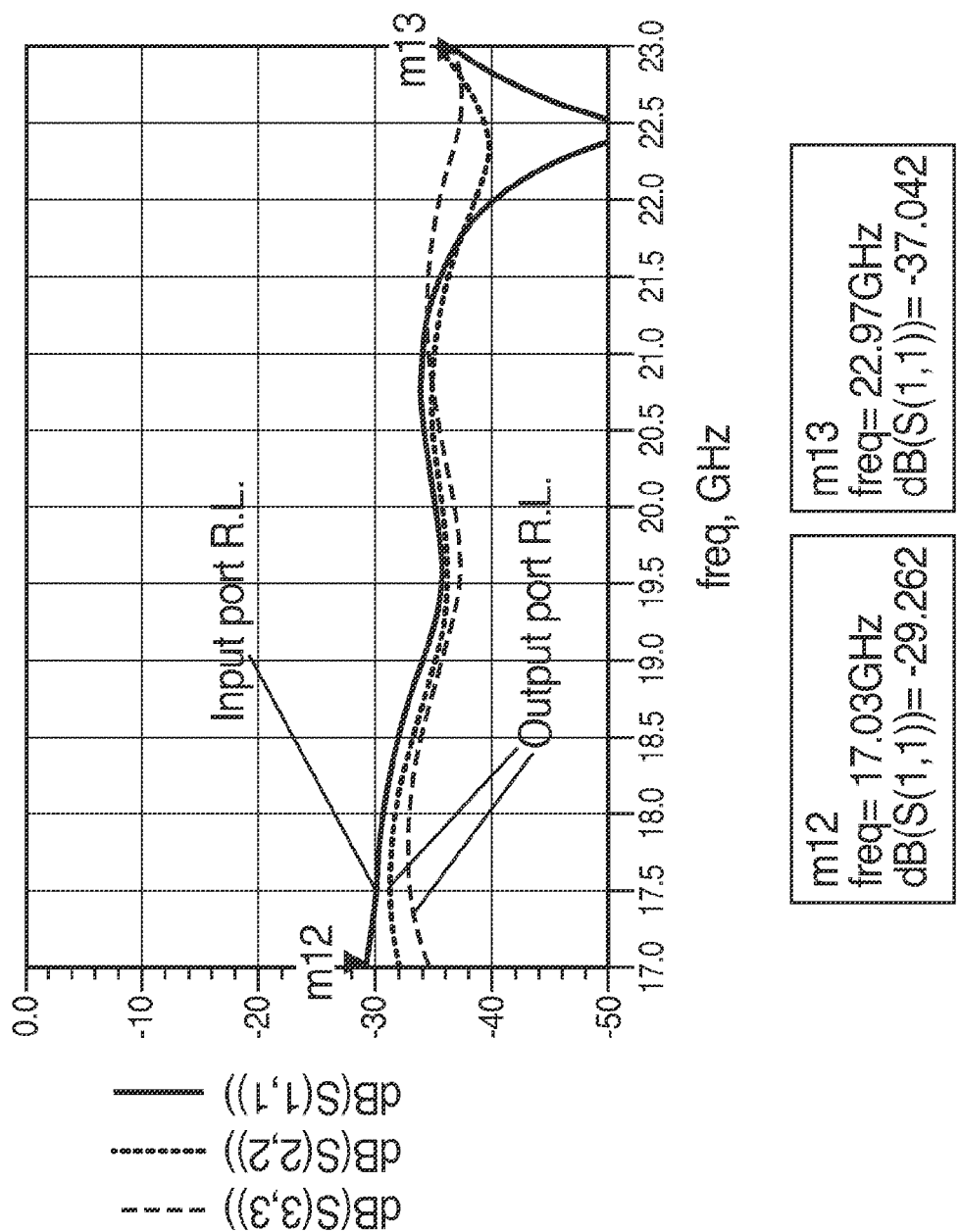
FIG. 24 illustrates a graph of return loss of simulated electromagnetic performance of a modeled exemplary K-band 2 way Wilkinson stripline power divider.

FIG. 24 illustrates return loss plot of the simulated electromagnetic performance of a modeled K band 2 way Wilkinson stripline power divider having the third modeled electromagnetic transitions.

Experimental Wilkinson power dividers at L band, C Band, Ku band and K band were also constructed and validated by applying various exemplary embodiments described herein. It will be understood that the various exemplary embodiments described herein may be further extended to N way power dividers (N=3, 4, 6, 8), quadrature couplers filters as well as active networks realized in stripline or microstrip technology over a wide frequency range (100 MHz through to 33 GHz).

While the above description provides examples of the embodiments, it will be appreciated that some features and/or functions of the described embodiments are susceptible to modification without departing from the spirit and principles of operation of the described embodiments. Accordingly, what has been described above has been intended to be illustrative of the invention and non-limiting and it will be understood by persons skilled in the art that other variants and modifications may be made without departing from the scope of the invention as defined in the claims appended hereto.

The invention claimed is:
1. A transmission line circuit assembly comprising:
a substrate layer having formed thereon a transmission line trace, the transmission line trace having a functional portion and a transitional portion;
an enclosure housing at least the transitional portion of the transmission line trace, an inner top surface of the enclosure having a recessed section defining a recess;
a dielectric plug partially positioned within the recess, the dielectric plug having opposing first and second surfaces, the first surface being conductively coupled to the recessed section of the inner top surface of the enclosure and the second surface being aligned and spaced apart from the transitional portion of the transmission line trace to define a gap therebetween; and a connecting pin having an interfacing portion and a connecting portion, the interfacing portion being housed within the enclosure and being bonded to the transitional portion of the transmission line trace, and the connecting portion being connectable to an external conductor.

2. The transmission line circuit assembly of claim 1, wherein the gap is filled with a dielectric filler having a dielectric constant substantially greater than 1.

3. The transmission line circuit assembly of claim 2, wherein the dielectric filler is chosen based on at least a simulated electromagnetic performance of the transmission line functional portion.

4. The transmission line circuit assembly of claim 2, wherein the dielectric filler is chosen from laminate material, glass reinforced laminate material, ceramic loaded laminate material, PTFE-based microwave laminate, liquid crystal polymer, ceramic based material, plastic based material, epoxy, silicone, acrylic and polyurethane coating.

5. The transmission line circuit assembly of claim 2, wherein an amount of the dielectric filler is chosen based on at least a simulated electromagnetic performance of the transmission line functional portion, the amount of dielectric filler at least partially filling the gap.

6. The transmission line circuit assembly of claim 2, wherein the dielectric filler surrounds the interfacing portion of the connecting pin, the surrounding reducing exertion of mechanical forces onto the interfacing portion of the connecting pin.

7. The transmission line circuit assembly of claim 1 t, wherein a width of the transmission line trace transitional portion is variable along its length to define at least one matching element.

8. The transmission line circuit assembly of claim 7, wherein one or more dimensions of the transmission line trace transitional portion is chosen based on at least a simulated electromagnetic performance of the transmission line functional portion.

9. The transmission line circuit assembly of claim 1, wherein the transmission line trace is a stripline trace formed in the substrate layer;
wherein the substrate layer has a non-recessed portion and a recessed portion, the functional portion of the stripline trace being formed in the non-recessed portion and the transitional portion being formed in the recessed portion; and
wherein the dielectric plug is aligned with the recessed portion of the substrate layer.

10. The transmission line circuit assembly of claim 1, wherein the transmission line trace transitional portion, the connecting pin interfacing portion, and the gap form an electromagnetic transition providing an impedance matching between the transmission line functional portion and the external conductor.

11. The transmission line circuit assembly of claim 1, wherein a thickness of the dielectric plug is chosen based on at least a simulated electromagnetic performance of the transmission line functional portion.

12. The transmission line circuit assembly of claim 1, wherein a material forming the dielectric plug is chosen based on at least a simulated electromagnetic performance of the transmission line functional portion.

13. The transmission line circuit assembly of claim 1, wherein the connecting pin interfacing portion is coated in a nonconductive layer insulating the interfacing portion from conductive portions of the assembly other than the transmission line trace transitional portion.

14. The transmission line circuit assembly of claim 1, wherein the connecting portion of the connecting pin extends through a throughhole of the enclosure, the assembly further comprising:
a non-conductive dielectric bead substantially surrounding an outer surface of the connecting portion of the connecting pin, the dielectric bead supporting the pin within the throughhole and providing suppression of mechanical forces on the connecting pin; and
a connector mechanically coupled to the enclosure about the throughhole;
wherein the connecting pin is expandable in its axial direction independently of an expansion of the connector.

15. A process for manufacturing a transmission line circuit assembly, the process comprising:
bonding an interfacing portion of a connecting pin to a transitional portion of a transmission line trace; and
housing at least the transmission line trace transitional portion within an enclosure having a dielectric plug, an inner top surface of the enclosure having a recessed section defining a top surface recess, the dielectric plug being partially positioned within the top surface recess, a first surface of the dielectric plug being coupled to the recessed section of the inner top surface of the enclosure and a second surface of the dielectric plug being aligned and spaced apart from the transitional portion of the transmission line trace to define a gap therebetween.

16. The process of claim 15, further comprising:
simulating an electromagnetic performance of a transmission line circuit;
choosing dimensions of the transitional portion based on the simulated performance of the transmission line circuit; and
forming in a substrate layer the transmission line trace having a functional portion and the transitional portion, the functional portion of the transmission line trace being formed according to the simulated transmission line circuit and the transitional portion having the chosen dimensions.

17. The process of claim 15, further comprising:
simulating an electromagnetic performance of a transmission line circuit;
choosing a material for forming a dielectric filler based on the simulated performance of the transmission line circuit; and
disposing a dielectric filler about the transitional portion, the dielectric filler occupying the gap when the transitional portion is housed within the enclosure.

18. The process of claim 15, further comprising:
simulating an electromagnetic performance of a transmission line circuit; and
choosing a thickness of the dielectric plug based on the simulated performance of the transmission line circuit.

19. The process of claim 15, further comprising:
simulating an electromagnetic performance of a transmission line circuit; and
choosing a material of the dielectric plug based on the simulated performance of the transmission line circuit.

20. The process of claim 15, further comprising coating the connecting pin interfacing portion in nonconductive layer to insulate the interfacing portion from conductive portions of the assembly other than the transmission line trace transitional portion.

21. The process of claim 15, wherein the transmission line trace is a stripline trace being supported by a substrate layer, the process further comprising:
- forming a substrate recess at an edge region of a first surface of the substrate layer to expose the transitional portion of the transmission line trace;
- forming the top surface recess on the inner top surface of the enclosure at a location corresponding to the recess of the first surface of the substrate layer; and
- adhering the dielectric plug within the recess of the inner top surface.

22. The process of claim 15, further comprising:
- simulating an electromagnetic performance of a transmission line circuit;
- choosing dimensions of the transitional portion based on the simulated performance of the transmission line circuit;
- forming in a substrate layer the transmission line trace having a functional portion and the transitional portion, the functional portion of the transmission line trace being formed according to the simulated transmission line circuit and the transitional portion having the chosen dimensions;
- choosing a thickness of the dielectric plug based on the simulated performance of the transmission line circuit; and
- choosing a material of the dielectric plug based on the simulated performance of the transmission line circuit.

\* \* \* \* \*